(12) United States Patent
Sahoda et al.

(10) Patent No.: US 9,236,283 B2
(45) Date of Patent: Jan. 12, 2016

(54) CHAMBER APPARATUS AND HEATING METHOD

(71) Applicant: Tokyo Ohka Kogyo Co., Ltd., Kawasaki-shi (JP)

(72) Inventors: Tsutomu Sahoda, Kawasaki (JP); Yoshiaki Masu, Kawasaki (JP); Takashi Maruyama, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 366 days.

(21) Appl. No.: 13/795,764

(22) Filed: Mar. 12, 2013

(65) Prior Publication Data

US 2014/0263273 A1 Sep. 18, 2014

(51) Int. Cl.
- *H05B 3/68* (2006.01)
- *A21B 2/00* (2006.01)
- *H01L 21/677* (2006.01)
- *H01L 21/67* (2006.01)

(52) U.S. Cl.
CPC ...... *H01L 21/67739* (2013.01); *H01L 21/6719* (2013.01); *H01L 21/6776* (2013.01); *H01L 21/67109* (2013.01); *H01L 21/67126* (2013.01); *H01L 21/67173* (2013.01)

(58) Field of Classification Search
CPC ............. H01L 21/67109; H01L 21/67126; H01L 21/67173; H01L 21/6719; H01L 21/67739; H01L 21/6776

USPC .......... 219/443.1–468.2; 392/416–418; 118/724, 725

See application file for complete search history.

(56) References Cited

U.S. PATENT DOCUMENTS

| | | | | |
|---|---|---|---|---|
| 5,085,887 A | * | 2/1992 | Adams et al. | 427/585 |
| 5,772,770 A | * | 6/1998 | Suda et al. | 118/719 |
| 6,111,225 A | * | 8/2000 | Ohkase et al. | 219/390 |
| 8,349,085 B2 | * | 1/2013 | Tahara et al. | 118/719 |
| 2005/0009229 A1 | | 1/2005 | Mitzi | |
| 2009/0205714 A1 | | 8/2009 | Kühnlein et al. | |

FOREIGN PATENT DOCUMENTS

| | | |
|---|---|---|
| EP | 0318315 A2 | 5/1989 |
| JP | A-01-231313 | 9/1989 |
| JP | A-11-273783 | 10/1999 |
| JP | A-11-340482 | 12/1999 |
| JP | A-2005-051224 | 2/2005 |
| JP | A-2009-537997 | 10/2009 |

\* cited by examiner

*Primary Examiner* — Sang Y Paik
(74) *Attorney, Agent, or Firm* — Knobbe Martens Olson & Bear LLP

(57) ABSTRACT

A chamber apparatus including a chamber which accommodates a substrate having a coating film formed thereon; a first heating part which is accommodated in the chamber and disposed on a first face side of the substrate; a second heating part which is accommodated in the chamber and disposed on a second face side of the substrate opposite to the first face; and a pressure control part which is capable of pressurizing and depressurizing inside of the chamber in a heated state.

14 Claims, 20 Drawing Sheets

(a)

(b)

CHAMBER APPARATUS AND HEATING METHOD

FIELD OF THE INVENTION

The present invention relates to a chamber apparatus and a heating method.

DESCRIPTION OF THE RELATED ART

A CIGS solar cell or a CZTS solar cell formed by semiconductor materials including a metal such as Cu, Ge, Sn, Pb, Sb, Bi, Ga, In, Zn, and a combination thereof, and a chalcogen element such as S, Se, Te, and a combination thereof has been attracting attention as a solar cell having high conversion efficiency (for example, see Patent Documents 1 to 3).

For example, a CZTS solar cell has a structure in which a film including four types of semiconductor materials, namely, Cu, Zn, Sn, and Se is used as a light absorbing layer (photoelectric conversion layer). In such solar cells, a configuration is known in which a back electrode made of molybdenum is provided on a substrate such a glass, and the aforementioned light absorbing layer is provided on the back electrode.

In a CZTS solar cell, since it is possible to reduce the thickness of the light absorbing layer compared to a conventional solar cell, it is easy to install the CIGS solar cell on a curved surface and to transport the CIGS solar cell. For this reason, it is expected that CIGS solar cells can be used in various application fields as a high-performance, flexible solar cell. As a method of forming the light absorbing layer, a method of forming the light absorbing layer through depositing or sputtering is conventionally known (for example, see Patent Documents 2 to 5).

DOCUMENTS OF RELATED ART

Patent Documents

[Patent Document 1] Japanese Unexamined Patent Application, First Publication No. Hei 11-340482
[Patent Document 2] Japanese Unexamined Patent Application, First Publication No. 2005-51224
[Patent Document 3] Published Japanese Translation No. 2009-537997 of the PCT International Publication
[Patent Document 4] Japanese Unexamined Patent Application, First Publication No. Hei 1-231313
[Patent Document 5] Japanese Unexamined Patent Application, First Publication No. Hei 11-273783

SUMMARY OF THE INVENTION

In contrast, as the method of forming the light absorbing layer, the present inventors propose a method of coating the semiconductor materials in the form of a liquid material on a substrate, followed by heating the substrate to form a coating film. In such a method of forming the light absorbing layer, the following problems arise.

Depending on the heating conditions such as the temperature and the pressure in the heating of the substrate, the photoelectric conversion efficiency of the formed coating film changes. Therefore, in order to form a coating film having a high photoelectric conversion efficiency, it is demanded to appropriately control the ambient conditions of the substrate during heating.

The present invention takes the above circumstances into consideration, with an object of providing a chamber apparatus which exhibits an excellent ability of controlling the ambient conditions of the substrate, and a heating method.

A chamber apparatus according to a first aspect of the present invention includes a chamber which accommodates a substrate having a coating film formed thereon; a first heating part which is accommodated in the chamber and disposed on a first face side of the substrate; a second heating part which is accommodated in the chamber and disposed on a second face side of the substrate opposite to the first face; and a pressure control part which is capable of pressurizing and depressurizing inside of the chamber in a heated state.

According to the present invention, it becomes possible to pressurize and depressurize inside of the chamber using the pressure control part, while the substrate is heated in a state where the substrate is sandwiched between the first heating part disposed on the first face side of the substrate and the second heating part disposed on the second face side of the substrate. Therefore, the ambient pressure of the coating film during heating can be controlled to a high pressure or a low pressure, so as to obtain a desired value. As such, a chamber apparatus which exhibits an excellent ability of controlling the ambient conditions of the substrate can be provided.

In the chamber apparatus, the chamber may have a gas supply part which supplies a reaction promoter gas to the ambient atmosphere of the coating film.

According to this embodiment, since a reaction promoter gas can be supplied to the ambient atmosphere of the coating film, the heat treatment of the coating film can be conducted smoothly.

The chamber apparatus may further include a gas flow part which allows a temperature control gas to flow between the first heating part and the second heating part.

According to this embodiment, since a temperature control gas is allowed to flow between the first heating part and the second heating part, the temperature of the space between the first heating part and the second heating part can be promptly controlled. By virtue of allowing a temperature control gas to flow in a state where the substrate is disposed between the first heating part and the second heating part, the temperature of the substrate can be promptly controlled. As a result, the waiting time until the temperature of the substrate is controlled can be shortened.

In the chamber apparatus, the chamber may have a substrate loading opening where the substrate is loaded, and the gas flow part may have a gas ejection opening which is directed from outside of the substrate loading opening to inside of the chamber.

According to this embodiment, the gas flow part can eject gas to the inside of the chamber by using the substrate loading opening. By virtue of such configuration, there is no need to separately provide an opening for supplying gas to the inside of the chamber, thereby avoiding the configuration of the chamber from becoming complicated.

In the chamber apparatus, the gas ejection opening may be configured to be capable of being lifted up and down.

According to this embodiment, the gas ejection opening can be directed to the substrate loading opening if desired, and if not, the gas ejection opening can be withdrawn from the substrate loading opening. As a result, the loading and unloading of the substrate can be conducted smoothly.

In the chamber apparatus, the gas flow part may have a suction opening which is provided at a position which sandwiches the first heating part and the second heating part with the gas ejection opening in a flowing direction of the temperature control gas.

According to this embodiment, since the temperature control gas ejected from the gas ejection opening can be suctioned from the suction opening, the flow of the temperature control gas can be promoted. As a result, transfer of heat can be conducted smoothly, so that the substrate can be cooled efficiently.

In the chamber apparatus, the gas flow part may have a circulation path which returns the temperature control gas suctioned from the suction opening to the gas ejection opening.

According to this embodiment, since the temperature control gas is recycled for use, the ambient environment of the substrate can be stabilized.

In the chamber apparatus, the circulation path may have a filter which removes foreign matters contained in the temperature control gas.

In this embodiment, since foreign matters contained in the recycled temperature control gas can be removed, the foreign matters can be suppressed from being adhered to the substrate and the inside of the chamber. As a result, the environment of the substrate and the inside of the chamber can be maintained clean.

In the chamber apparatus, the chamber may have a first section and a second section which can be divided in one direction.

According to this embodiment, since the chamber can be divided into a first section and a second section, the efficiency of the loading/unloading of the substrate and the maintenance operations can be improved.

In the chamber apparatus, one of the first heating part and the second heating part may be provided in the first section, and the other may be provided in the second section.

According to this embodiment, the interval between the first heating part and the second heating part can be increased in correspondence with the dividing of the chamber. As a result, the efficiency of the loading/unloading of the substrate and the maintenance operations can be improved.

In the chamber apparatus, the first section and the second section may be relatively movable in a direction intersecting with a dividing direction.

According to this embodiment, by virtue of relatively moving the first section and the second section in a direction intersecting with the dividing direction, it becomes easier for a worker to access to the first section and the second section. As a result, the efficiency of the maintenance operations can be improved.

In the chamber apparatus, one of the first section and the second section may be configured to be drawable in one direction.

According to this embodiment, by drawing one of the first section and the second section in one direction, a relative movement can be realized. As a result, the operation efficiency can be improved.

In the chamber apparatus, the chamber may have a volume changing part formed in a ring which is inserted between the first section and the second section so as to change the volume of the inside of the chamber.

According to this embodiment, by changing the volume of the inside the chamber, the heating conditions can be determined over a wider range.

In the chamber apparatus, the chamber may have a connecting part which is provided on one of the first section and the second section and connects the volume changing part.

In this embodiment, since the volume changing part is connected to one of the first section and the second section, the structure of the chamber can be stabilized.

In the chamber apparatus, the chamber may have an inner wall face which surrounds the substrate, and at least a part of the inner wall face may be provided with a curved portion which is curved toward outside of the chamber.

According to this embodiment, since a curved portion is provided on part of the inner wall face of the chamber, the pressure resistance inside the chamber can be improved. As a result, even in the case where the inside of the chamber is pressurized, deformation of the chamber is unlikely to occur.

In the chamber apparatus, a heat insulation part may be provided at least one of a position between the inner wall face and the first heating part and a position between the inner wall face and the second heating part.

According to this embodiment, heat can be prevented from being conducted to the inner wall face. As a result, deformation of the inner wall face can be suppressed.

In the chamber apparatus, the first heating part and the second heating part may each independently have an outer periphery heating part which heats a ring-shaped outer peripheral region along an outer periphery of the substrate, and an inner periphery heating part which heats a ring-shaped inner peripheral region provided within the ring-shaped outer peripheral region.

According to this embodiment, the substrate can be heated while distinguishing the outer peripheral region and the inner peripheral region, thereby enabling to conduct heating with a high precision.

A method of heating according to a second aspect of the present invention includes: an accommodation step in which a substrate having a coating film formed thereon is accommodated in a chamber; a heating step in which the substrate accommodated in the chamber is heated using a first heating part disposed on a first face side of the substrate and a second heating part disposed on a second face side of the substrate opposite to the first face; and a switching step in which pressurizing and depressurizing inside of the chamber is switched depending on a heating state of the substrate.

According to the present invention, it becomes possible to pressurize and depressurize inside of the chamber using the pressure control part, while the substrate is heated by the first heating part disposed on the first face side of the substrate and the second heating part disposed on the second face side of the substrate. Therefore, the ambient pressure of the coating film during heating can be controlled to a high pressure or a low pressure, so as to obtain a desired value. As a result, the substrate can be heated under desired conditions.

According to the present invention, there are provided a chamber apparatus which exhibits an excellent ability of controlling the ambient conditions of the substrate, and a heating method.

DETAILED DESCRIPTION OF THE INVENTION

Hereinafter, one embodiment of the present invention will be described with reference to the accompanying drawings.

Figure 1:
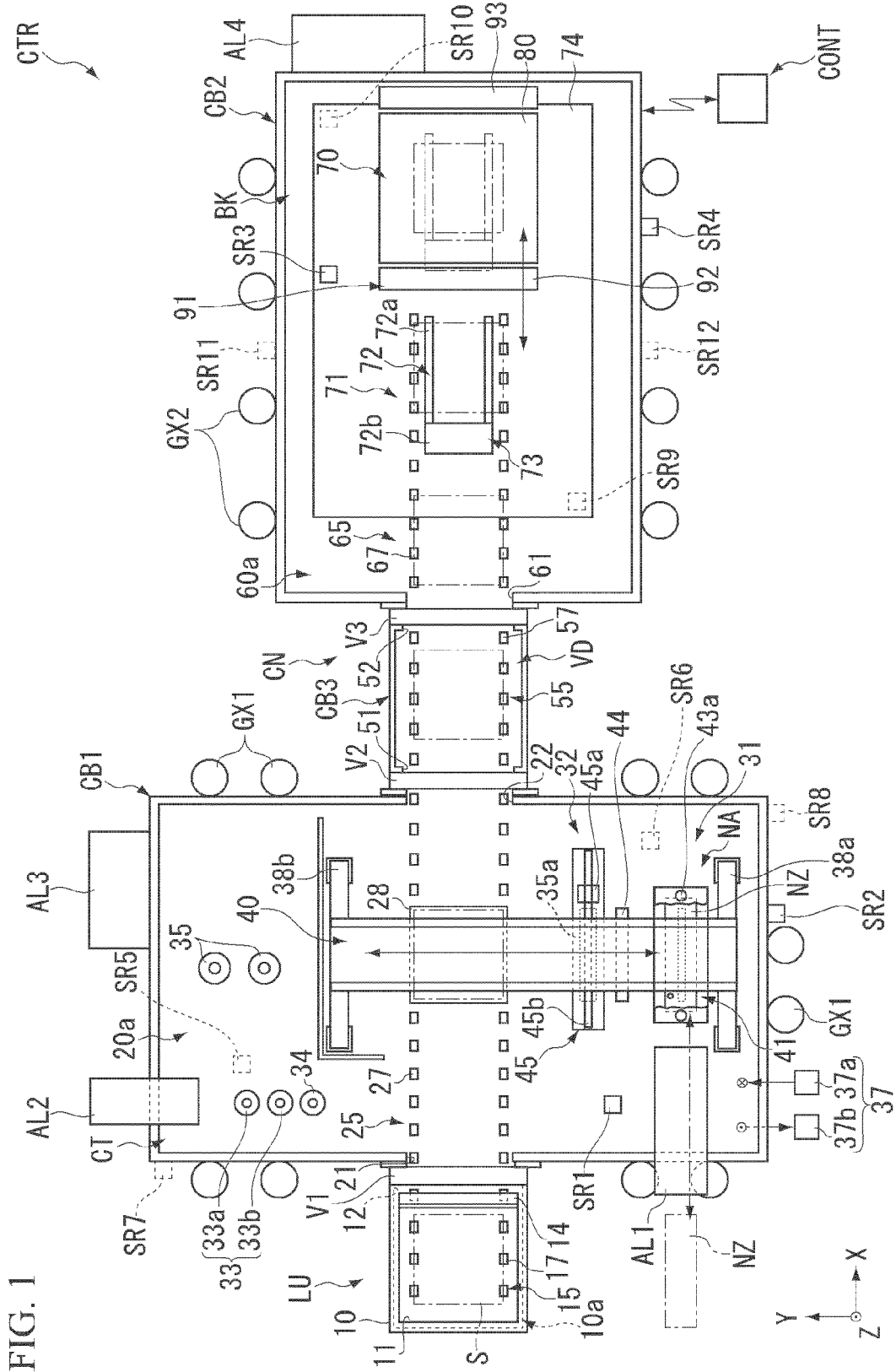
FIG. 1 A diagram showing an entire configuration of a coating apparatus according to one embodiment of the present invention.

FIG. 1 is a schematic diagram showing a configuration of a coating apparatus CTR according to one embodiment of the present invention.

As shown in FIG. 1, the coating apparatus CTR is an apparatus which applies a liquid material to a substrate S. The coating apparatus CTR includes a substrate loading/unloading part LU, a first chamber CB1, a second chamber CB2, a connection part CN and a control part CONT. The first chamber CB1 has a coating part CT. The second chamber CB2 has a baking part BK. The connection part CN has a vacuum drying part VD.

The coating apparatus CTR is used, for example, by being disposed on a floor FL in a factory. The coating apparatus may have a configuration in which the coating apparatus is accommodated in one room, or a configuration in which the coating apparatus is divisionally accommodated in a plurality of rooms. In the coating apparatus CTR, the substrate loading/unloading part LU, the coating part CT, the vacuum drying part VD and the baking part BK are arranged in this order in one direction.

With respect to the configuration of the coating apparatus CTR, it is not particularly limited that the substrate loading/unloading part LU, the coating part CT, the vacuum drying part VD and the baking part BK are arranged in this order in one direction. For example, the substrate loading/unloading part LU may be divided into a substrate loading part (not shown) and a substrate unloading part (not shown). Further, the vacuum drying part VD may be omitted. Needless to say, the aforementioned parts may not be arranged in one direction, and a configuration may be employed in which the aforementioned parts are arranged to be stacked in a vertical or horizontal direction with a robot (not shown) disposed at a central position.

In the respective drawings as below, upon describing the configuration of a chamber apparatus according to the present embodiment, for the purpose of simple marking, an XYZ coordinate system is used to describe the directions in the drawings. In the XYZ coordinate system, the plane parallel to the floor is regarded as the XY plane. On the XY plane, the direction in which the components of the coating apparatus CTR (the substrate loading/unloading part LU, the coating part CT, the vacuum drying part VD and the baking part BK) are arranged is marked as the X direction, and the direction perpendicular to the X direction on the XY plane is marked as the Y direction. The direction perpendicular to the XY plane is marked as the Z direction. In the X, Y, and Z directions, the arrow direction in the drawing is the +direction, and the opposite direction of the arrow direction is the −direction.

In this embodiment, as the substrate S, for example, a plate-shaped member made of glass, resin, or the like may be used. Further, in this embodiment, molybdenum is sputtered on the substrate S as a back electrode. Needless to say, any other electroconductive material may be used as a back electrode. Explanation will be given below, taking an example of a substrate having a size of 330 mm×330 mm as viewed in the Z direction. The size of the substrate is not limited to 330 mm×330 mm. For example, as the substrate S, a substrate having a size of 125 mm×125 mm may be used, or a substrate having a size of 1 m×1 m may be used. Needless to say, a substrate having a size larger than the aforementioned sizes or a substrate having a size smaller than the aforementioned sizes may be appropriately used.

In this embodiment, as the liquid material to be applied to the substrate 5, for example, a liquid composition is used which includes a solvent such as hydrazine and a metal material such as a combination of copper (Cu), indium (In), gallium (Ga), and selenium (Se) or a combination of copper (Cu), zinc (Zn), tin (Sn) and selenium (Se). The liquid composition includes a metal material for forming a light absorbing layer (photoelectric conversion layer) of a CIGS solar cell or a CZTS solar cell.

In the present embodiment, the liquid composition contains a substance for obtaining the grain size of a light absorbing layer of a CZTS solar cell for example. Needless to say, as the liquid material, a liquid material in which another metal (such as metal nano particles) is dispersed in the solution may be used.

(Substrate Loading/Unloading Part)

The substrate loading/unloading part LU loads a substrate S prior to being treated on the coating part CT, and unloads the treated substrate S from the coating part CT. The substrate loading/unloading part LU has a chamber 10. The chamber 10 is formed in the shape of a rectangular box. Inside the chamber 10, an accommodation room 10a capable of accommodating the substrate S is formed. The chamber 10 has a first opening 11, a second opening 12 and a lid portion 14. The first opening 11 and the second opening 12 communicates the accommodation room 10a with the outside of the chamber 10.

The first opening 11 is formed on a +Z-side face of the chamber 10. The first opening 11 is formed to have a size larger than the size of the substrate S as viewed in the Z direction. The substrate S to be taken out of the chamber 10 or the substrate S to be accommodated in the accommodation room 10a is place into or taken out of the substrate loading/unloading part LU through the first opening 11.

The second opening 12 is formed on a +X-side face of the chamber 10. The second opening 12 is formed to have a size larger than the size of the substrate S as viewed in the X direction. The substrate S supplied to the coating part CT or the substrate S returned from the coating part CT is place into or taken out of the substrate loading/unloading part LU through the second opening 12.

The lid portion 14 opens or closes the first opening 11. The lid portion 14 is formed in the shape of a rectangular plate. The lid portion 14 is attached to a +X-side edge of the first opening 11 via a hinge portion (not shown). Thus, the lid portion 14 is rotatable around the Y-axis, with the +X-side edge of the first opening 11 as the center. By rotating the lid portion 14 around the Y-axis, the first opening 11 can be opened or closed.

The accommodation room 10a is provided with a substrate transporting part 15. The substrate transporting part 15 includes a plurality of rollers 17. The rollers 17 are arranged in a pair in the Y-direction, and a plurality of the pairs are arranged in the X-direction.

Each of the rollers 17 is adapted to be rotatable about the Y direction serving as the central axis. The plurality of rollers 17 are formed to have the same diameter, and the +Z-side end of the plurality of rollers 17 are arranged on a same plane parallel to the XY plane. Thus, the plurality of rollers 17 are capable of supporting the substrate S in a state where the substrate S is parallel to the XY plane.

The rotation of each of the rollers 17 is controlled, for example, by a roller-rotation control part (not shown). By rotating each of the rollers 17 clockwise or anti-clockwise around the Y-axis in a state where the substrate S is supported by the plurality of rollers 17, the substrate transporting part 15 can transport the substrate S in an X-direction (+X-direction or −X-direction). As the substrate transporting part 15, a float transporting part (not shown) may be used to lift the substrate for transportation.

(First Chamber)

The first chamber CB1 is mounted on the base BC placed on the floor FL. The first chamber CB1 is formed in the shape of a rectangular box. Inside the first chamber CB1, an accommodation room 20a is formed. The coating part CT is provided in the treatment room 20a. The coating part CT performs the coating treatment of the liquid material on the substrate S.

The first chamber CB1 has a first opening 21 and a second opening 22. The first opening 21 and the second opening 22 communicate the treatment 20a with the outside of the first chamber CB1. The first opening 21 is formed on a −X-side face of the first chamber CB1. The second opening 22 is formed on a +X-side face of the first chamber CB1. The first opening 21 and the second opening 22 are formed to have a size which allows the substrate S to pass through. The substrate S is placed in or taken out of the first chamber CB1 through the first opening 21 and the second opening 22.

The coating part CT has an ejection part 31, a maintenance part 32, a liquid material supply part 33, a washing liquid supply part 34, a waste liquid storing part 35, a gas supply/exhaust part 37 and a substrate transporting part 25.

The ejection part 31 has a nozzle NZ, a treatment stage 28 and a nozzle actuator NA.

Figure 3:
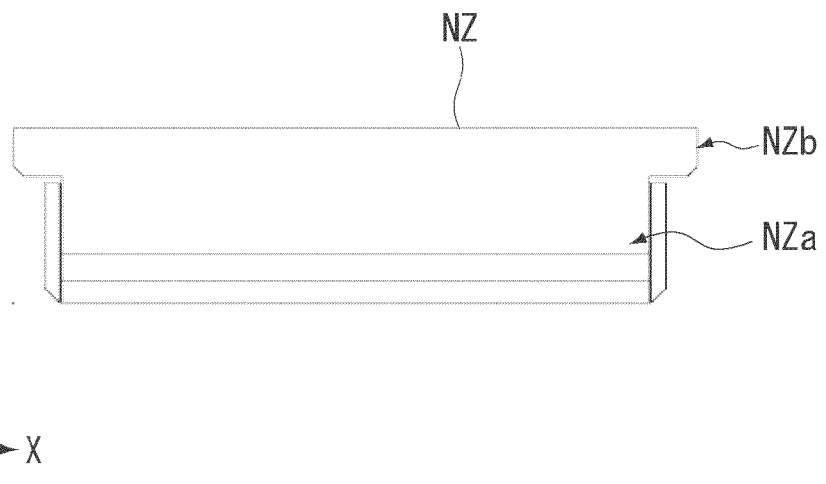
FIG. 3 A diagram showing a configuration of a nozzle according to the present embodiment.
Figure 3:
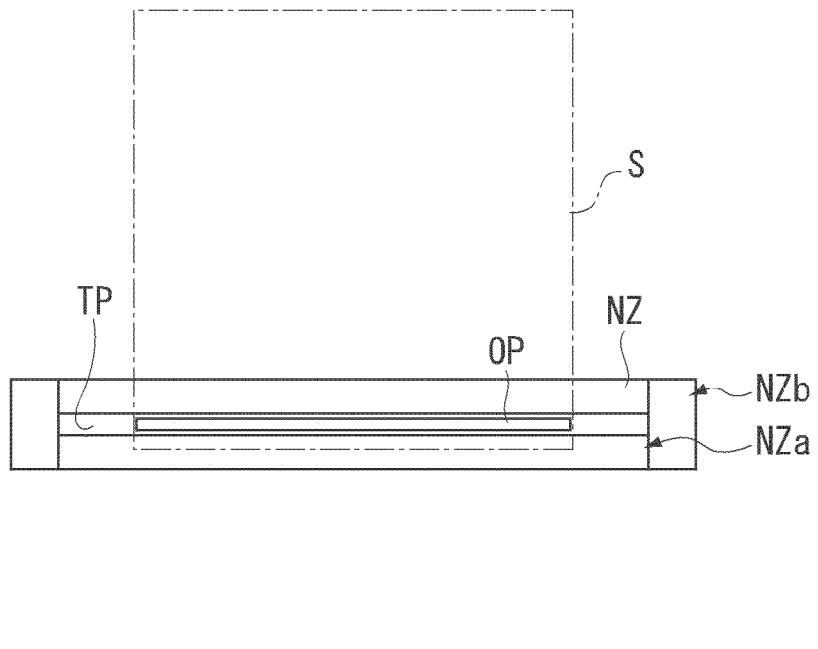

FIG. 3(a) is a diagram showing a configuration of the slit nozzle NZ.

As shown in FIG. 3(a), the nozzle NZ is formed to have an elongate shape, and is arranged such that the lengthwise direction thereof is in parallel to the X direction. The nozzle NZ has a main part NZa and a protruding part NZb. The main part NZa is a housing capable of accommodating the liquid material inside thereof. The main part NZa is made of, for example, a material containing titanium or a titanium alloy. The protruding part NZb is formed to protrude from the main part NZa on the +X-side and the −X-side. The protruding part NZb is held by part of the nozzle actuator NA.

FIG. 3(b) shows the configuration when the nozzle NZ is viewed from the −Z direction side thereof.

As shown in FIG. 3(b), the nozzle NZ has an ejection opening OP on the −Z-side end (tip TP) of the main part NZa. The ejection opening OP is an opening for ejecting a liquid material. The ejection opening OP is formed as a slit elonging in the X direction. The ejection opening OP is formed, for example, so that the longitudinal direction thereof is substantially equal to the X-direction dimension of the substrate S.

The nozzle NZ ejects, for example, a liquid material in which four types of metals, namely, Cu, In, Ga, and Se are mixed with a predetermined composition ratio. The nozzle NZ is connected to a liquid supply part 33 via a connection pipe or the like (not shown). The nozzle NZ includes a holding part which holds the liquid material therein. A temperature control part which controls the temperature of the liquid material held by the holding part may be provided.

Figure 2:
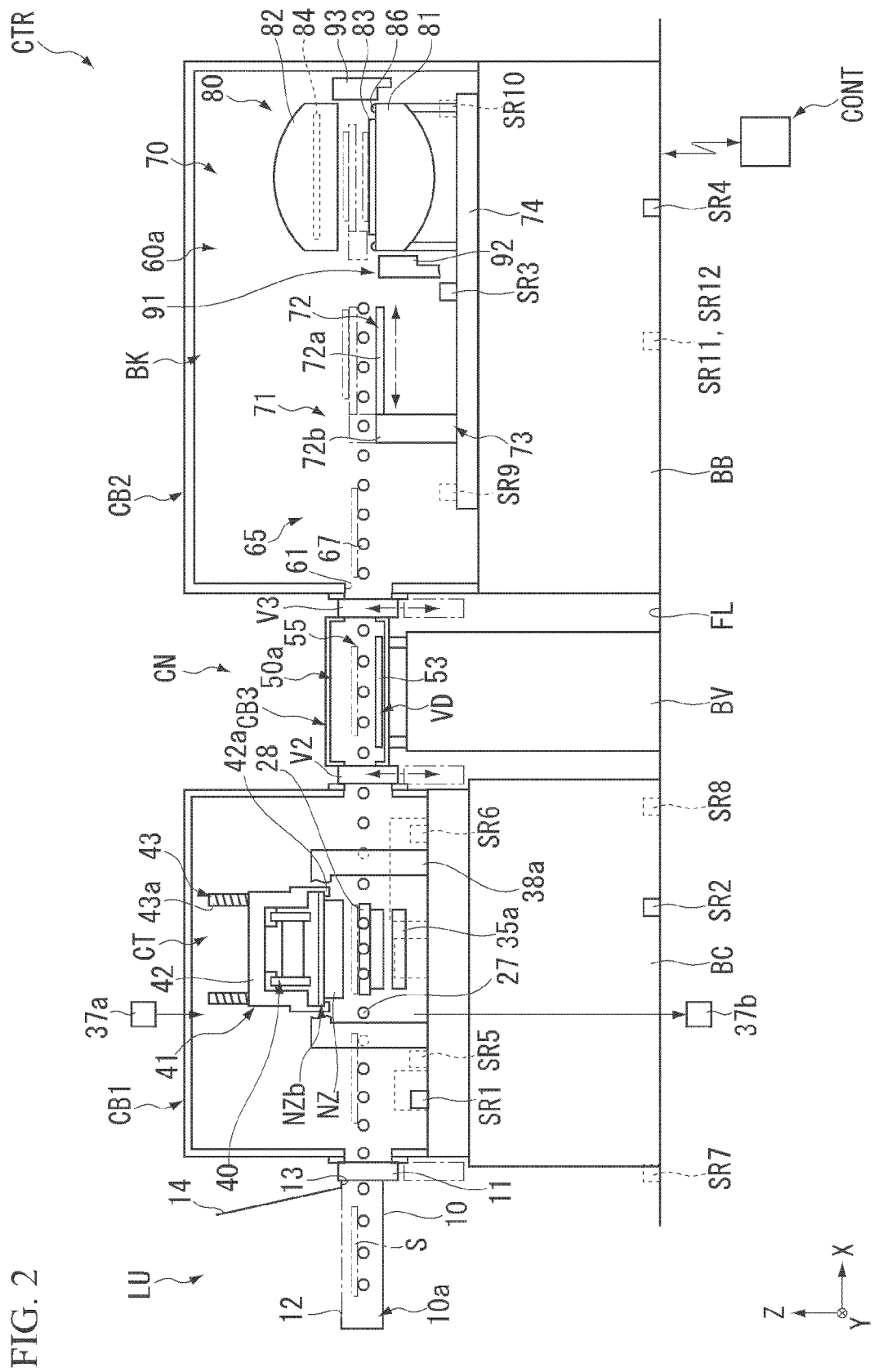
FIG. 2 A diagram showing an entire configuration of the coating apparatus according to the present embodiment.

Returning to FIG. 1 and FIG. 2, the substrate S to be subjected to a coating treatment is mounted on the treatment stage 28. The +Z-side face of the treatment stage 28 is a substrate mounting face where the substrate S is mounted. The substrate mounting face is formed to be in parallel with the XY plane. The treatment stage 28 is made of, for example, stainless steel.

The nozzle actuator NA moves the nozzle NZ in the X direction. The nozzle actuator NA has a stator 40 and a mover 41 which constitutes a linear motor mechanism. As the nozzle actuator NA, any other actuator having another configuration such as a ball screw configuration may be used. The stator 40 is elongated in the Y direction. The stator 40 is supported by a support frame 38. The support frame 38 has a first frame 38a and a second frame 38b. The first frame 38a is provided on a −Y-side end portion of the treatment room 20a. The second frame 38b is provided in the treatment room 20a such that the treatment stage 28 is positioned between the first frame 38a and the second frame 38b.

The mover 41 is movable along the direction where the stator 40 is elonged (Y direction). The mover 41 has a nozzle supporting member 42 and an elevator part 43. The nozzle supporting member 42 is formed in the shape of a gate, and has a holding part 42a which holds the protruding part NZb of the nozzle NZ. The nozzle supporting member 42 integrally moves with the elevator part 43 along the stator 40 between the first frame 38a and the second 38b in the Y direction. Thus, the nozzle NZ held by the nozzle supporting member 42 moves in the Y direction over the treatment stage 28. The nozzle supporting member 42 moves along the elevation guide 43a of the elevator part 43 in the Z direction. The mover 41 has an actuator source (not shown) which moves the nozzle supporting member 42 in the Y direction and the Z direction.

The maintenance part 32 is where the maintenance of the nozzle NZ is performed. The maintenance part 32 has a nozzle standby part 44 and a nozzle-tip control part 45.

The nozzle standby part 44 has a dipping part (not shown) where the tip TP of the nozzle NZ is dipped to prevent it from drying, and a discharge part (not shown) which discharges the liquid material held within the nozzle NZ when the nozzle NZ is changed or the liquid material to be supplied to the nozzle NZ is changed.

The nozzle-tip control part 45 adjusts the conditions of the nozzle tip by washing the tip TP of the nozzle NZ and the vicinity thereof, and conducting preliminary ejection from the ejection opening OP of the nozzle NZ. The nozzle-tip control part 45 has a wiping part 45a which wipes the tip TP of the nozzle NZ and a guide rail 45b which guides the wiping part 45a. The nozzle-tip control part 45 is provided with a waste liquid accommodation part 35a which accommodates the liquid material discharged from the nozzle NZ and the washing liquid used for washing the nozzle NZ.

Figure 4:
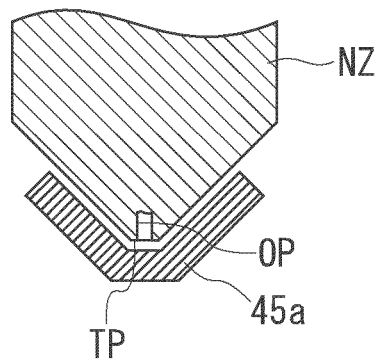
FIG. 4 A diagram showing a configuration of part of a coating part according to the present embodiment.

FIG. 4 is a diagram showing the cross-sectional shape of the nozzle NZ and the nozzle-tip control part 45. As shown in FIG. 4, the wiping part 45a is formed to cover the tip TP of the nozzle NZ and part of the inclined plane on the tip TP-side in the cross-sectional view.

The guide rail 45b extends in the X direction to cover the opening OP of the nozzle NZ. The wiping part 45a is adapted to be movable by an actuator source (not shown) along the guide rail 45b in the X direction. By moving the wiping part 45a in the X direction while being in contact with the tip TP of the nozzle NZ, the tip TP can be wiped.

The liquid material supply part 33 has a first liquid material accommodation part 33a and a second liquid material accommodation part 33b. The first liquid material accommodation part 33a and the second liquid material accommodation part 33b accommodate the liquid material to be applied to the substrate S. Further, the first liquid material accommodation part 33a and the second liquid material accommodation part 33b are capable of accommodating a plurality of different types of liquid materials.

The washing liquid supply part 34 accommodates a washing liquid which washes various parts of the coating part, such as the inside of the nozzle NZ and the nozzle-tip control part 45. The washing liquid supply part 34 is connected to the inside of the nozzle NZ and the nozzle-tip control part 45 via a pipe and a pump (which are not shown).

The waste liquid storing part 35 collects the liquid ejected from the nozzle NZ and is not reused. The nozzle-tip control part 45 may have a configuration in which the part which conducts the preliminary ejection and the part which washes the tip TP of the nozzle NZ are individually provided. Alternatively, the preliminary ejection may be conducted at the nozzle standby part 44.

The gas supply/exhaust part 37 has a gas supply part 37a and a gas exhaust part 37b. The gas supply part 37a supplies an inert gas such as a nitrogen gas or an argon gas to the treatment room 20a. The gas exhaust part 37b suctions the treatment room 20a, and discharges the gas in the treatment room 20a outside the first chamber CB1.

The substrate transporting part 25 transports the substrate S inside the treatment room 20a. The substrate transporting part 25 includes a plurality of rollers 27. The rollers 27 are arranged in the X-direction to be intersected into two lines by a central portion of the treatment room 20a in the Y-direction. The rollers 27 arranged in each line support the +Y-side end and −Y-side end of the substrate S.

By rotating each of the rollers 27 clockwise or anti-clockwise around the Y-axis in a state where the substrate S is supported by the plurality of rollers 27, the substrate S supported by each of the rollers 27 is transported in an X-direction (+X-direction or −X-direction). A float transporting part (not shown) may be used to lift the substrate for transportation.

(Connection Part)

The connection part CN connects the first chamber CB1 and the second chamber CB2. The substrate S is moved between the first chamber CB1 and the second chamber CB2 via the connection part CN. The connection part CN has a third chamber CB3. The third chamber CB3 is formed in the shape of a rectangular box. Inside the third chamber CB3, a treatment room 50a is formed. In the present embodiment, the treatment room 50a is provided with a vacuum drying part VD. The vacuum drying part VD dries the liquid material coated on the substrate S. The third chamber CB3 is provided with gate valves V2 and V3.

The third chamber CB3 has a first opening 51 and a second opening 52. The first opening 51 and the second opening 52 communicate the treatment room 50a with the outside of the third chamber CB3. The first opening 51 is formed on a −X-side face of the third chamber CB3. The second opening 52 is formed on a +X-side face of the third chamber CB3. The first opening 51 and the second opening 52 are formed to have a size which allows the substrate S to pass through. The substrate S is placed in or taken out of the third chamber CB3 through the first opening 51 and the second opening 52.

The vacuum drying part VD has a substrate transporting part 55, a gas supply part 58, a gas exhaust part 59 and a heating part 53.

The substrate transporting part 55 includes a plurality of rollers 57. The rollers 57 are arranged in a pair in the Y-direction, and a plurality of the pairs are arranged in the X-direction. The plurality of rollers 57 supports the substrate S which is disposed in the treatment room 50a via the first opening 51.

By rotating each of the rollers 57 clockwise or anti-clockwise around the Y-axis in a state where the substrate S is supported by the plurality of rollers 57, the substrate S supported by each of the rollers 57 is transported in an X-direction (+X-direction or −X-direction). A float transporting part (not shown) may be used to lift the substrate for transportation.

Figure 5:
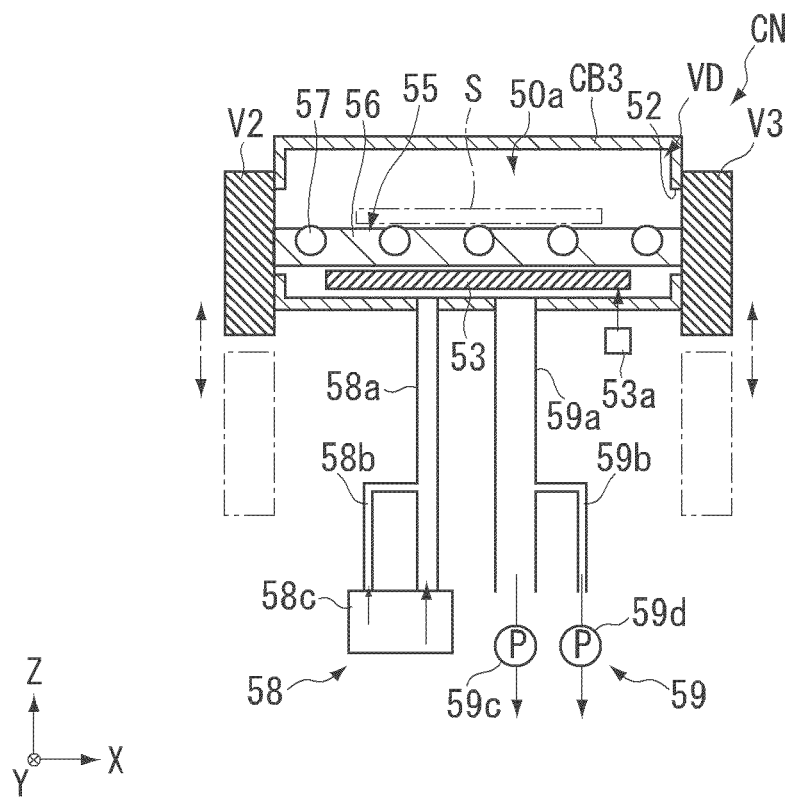
FIG. 5 A diagram showing a configuration of a vacuum drying part according to the present embodiment.

FIG. 5 is a schematic diagram showing a configuration of the vacuum drying part VD.

As shown in FIG. 5, the gas supply part 58 supplies an inert gas such as a nitrogen gas or an argon gas to the treatment room 50a. The gas supply part 58 has a first supply part 58a and a second supply part 58b. The first supply part 58a and the second supply part 58b are connected to a gas supply source 58c such as a gas bomb or a gas pipe. Supplying of a gas to the treatment room 50a is performed mainly by using the first supply part 58a. The second supply part 58b makes a fine control of the amount of gas supplied by the first supply part 58a.

The gas exhaust part 59 suctions the treatment room 50a, and discharges the gas in the treatment room 50a outside the third chamber CB3, thereby reducing the pressure inside the treatment room 50a. By reducing the pressure inside the treatment room 50a, evaporation of the solvent contained in the liquid material on the substrate S can be promoted, thereby drying the liquid material. The gas exhaust part 59 has a first suction part 59a and a second suction part 59b. The first suction part 59a and the second suction part 59b are connected to a suction source 59c and 59d such as a pump. Suction from the treatment room 50a is performed mainly by using the first suction part 59a. The second suction part 59b makes a fine control of the amount of suction by the first suction part 59a.

The heating part 53 heats the liquid material on the substrate S disposed in the treatment room 50a. As the heating part 53, an infrared device or a hot plate is used. The temperature of the heating part 53 can be controlled, for example, from room temperature to about 100° C. By using the heating part 53, evaporation of the solvent contained in the liquid material on the substrate S can be promoted, thereby supporting the drying treatment under reduced pressure.

The heating part 53 is connected to a lifting mechanism (moving part) 53a. The lifting mechanism 53a moves the heating part 53 in the Z-direction. As the lifting mechanism 53a, for example, a motor mechanism or an air-cylinder mechanism is used. By moving the heating part 53 in the Z-direction using the lifting mechanism 53a, the distance between the heating part 53 and the substrate S can be adjusted. With respect to the heating part 53, the distance to be moved and the timing to be moved by the lifting mechanism 53a can be controlled by the control part CONT.

(Second Chamber)

The second chamber CB2 is mounted on the base BB placed on the floor FL. The second chamber CB2 is formed in the shape of a rectangular box. Inside the second chamber CB2, a treatment room 60a is formed. The baking part BK is provided in the treatment room 60a. The baking part BK bakes the coating film coated on the substrate S.

The second chamber CB2 has an opening 61. The opening 61 communicates the treatment room 60a with the outside of the second chamber CB2. The opening 61 is formed on a −X-side face of the second chamber CB2. The opening 61 is formed to have a size which allows the substrate S to pass through. The substrate S is placed in or taken out of the second chamber CB2 through the opening 61.

The baking part BK has a substrate transporting part 65, a gas supply part 68, a gas exhaust part 69 and a heating part 70.

The substrate transporting part 65 has a plurality of rollers 67 and an arm part 71. The rollers 67 are arranged in a pair in the Y-direction on the substrate guide stage 66, and a plurality of the pairs are arranged in the X-direction. The plurality of rollers 67 supports the substrate S which is disposed in the treatment room 60a via the opening 61.

By rotating each of the rollers 67 clockwise or anti-clockwise around the Y-axis in a state where the substrate S is supported by the plurality of rollers 67, the substrate S supported by each of the rollers 67 is transported in an X-direction (+X-direction or −X-direction). A float transporting part (not shown) may be used to lift the substrate for transportation.

The arm part 71 is disposed on a platform 74, and transfers the substrate S between the plurality of rollers 67 and the heating part 70. The arm part 71 has a transport arm 72 and an arm actuator 73. The transport arm 72 has a substrate supporting part 72a and a moving part 72b. The substrate supporting part 72a supports the +Y-side edge and −Y-side edge of the substrate S. The moving part 72b is attached to the substrate supporting part 72a, and is movable in the X-direction and the θZ-direction. The arm part 71 is disposed, for example, on the −Z-side of the rollers 67, and is movable over the rollers 67 in the Z-direction. Therefore, for example, when the substrate S is disposed on the rollers 67, the substrate S can be held by moving from the −Z-side to the +Z-side of the rollers 67 in the Z-direction.

The arm actuator 73 actuates the moving part 72b in the X-direction or the θZ-direction. When the moving part 72b is moved in the +X-direction by the arm actuator 73, the substrate supporting part 72a is inserted inside the heating part 70, and the substrate S is placed at a central portion of the heating part 70 as viewed in the Z-direction.

Figure 6:
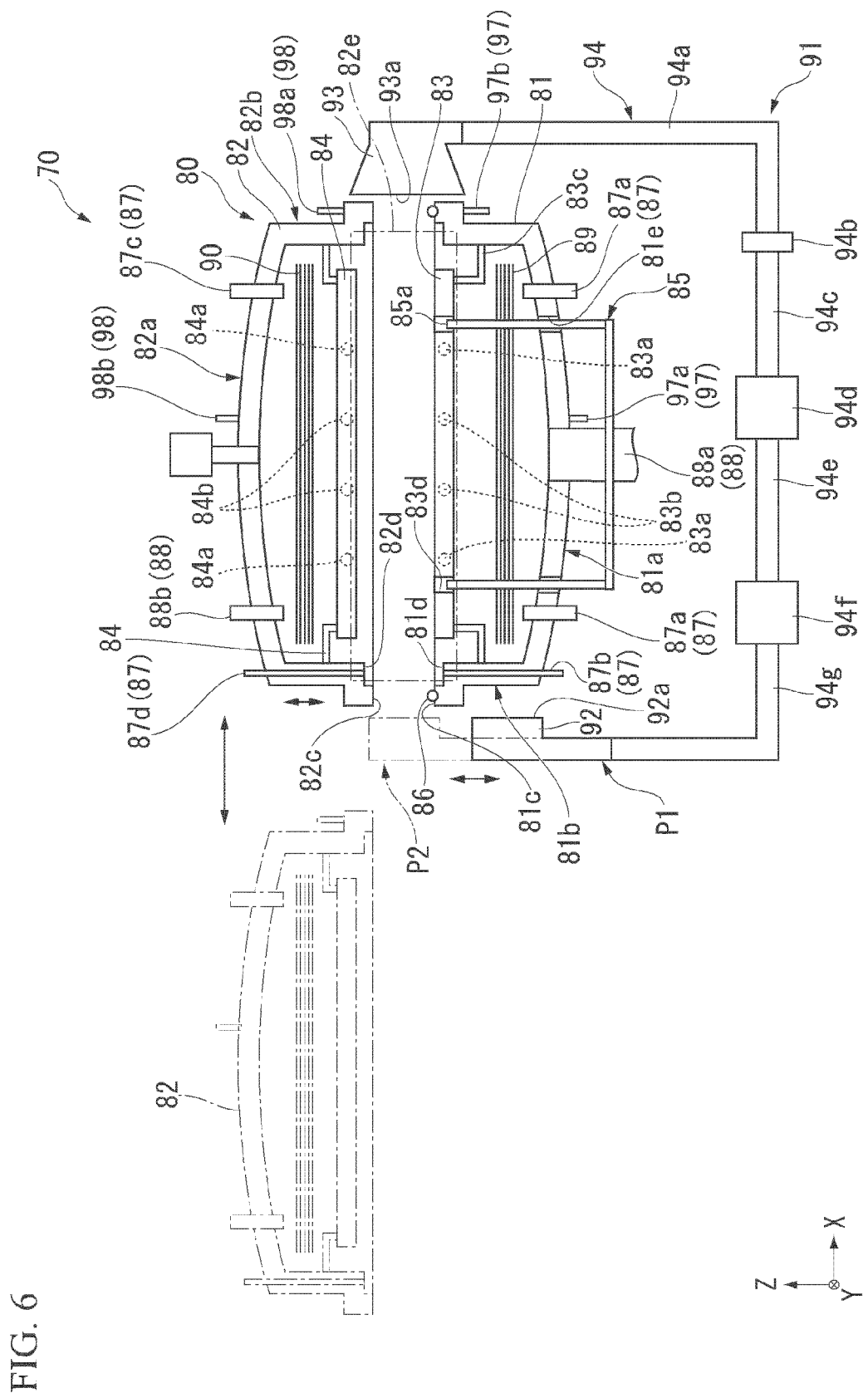
FIG. 6 A diagram showing a configuration of part of a baking part according to the present embodiment.

FIG. 6 is a cross-sectional view showing the configuration of the heating part 70.

As shown in FIG. 6, the heating part 70 has a chamber apparatus 80 disposed on the platform 74 (see FIG. 1). The chamber apparatus 80 has a first accommodation part 81, a second accommodation part 82, a first heating plate 83, a second heating plate 84, a lifting part 85, a sealing part 86, a gas supply part 87, an exhaust part 88, a first heat insulation part 89 (lower side), a second heat insulation part 90 (upper side) and a gas flow part 91.

The first accommodation part 81 is formed in the shape of a rectangle as viewed in the Z-direction, and is mounted on the bottom of the second chamber CB2 such that the opening faces the +Z side. The second accommodation part 82 is formed in the shape of a rectangle as viewed in the Z-direction, and is disposed such that the opening faces the first accommodation part 81. The second accommodation part 82 is movable in the Z direction by using a lifting mechanism (not shown). By superimposing the second accommodation part 82 on the first accommodation part 81, the inside of the first accommodation part 81 and the second accommodation part 82 is closed.

Further, the second accommodation part 82 is configured to be movable in the X-direction. Specifically, as shown in FIG. 6, the second accommodation part 82 can be slid from a position overlapping with the second accommodation part 82 as viewed in the Z direction to −X-direction. In such a case, for example, the second accommodation part 82 may be connected to a guide rail (not shown) which extends in parallel to the X direction, and the second accommodation part 82 may be configured to be movable along the guide rail.

The second accommodation part 82 may be configured to be movable, for example, by an actuator (not shown) such as a motor mechanism or an air cylinder mechanism. Alternatively, the second accommodation part 82 may be configured to be movable by hands of a worker. Furthermore, in the case of moving the second accommodation part 82, the second accommodation part 82 may be configured to be switchable between the movement by an actuator and the movement by hands of a worker.

Figure 7:
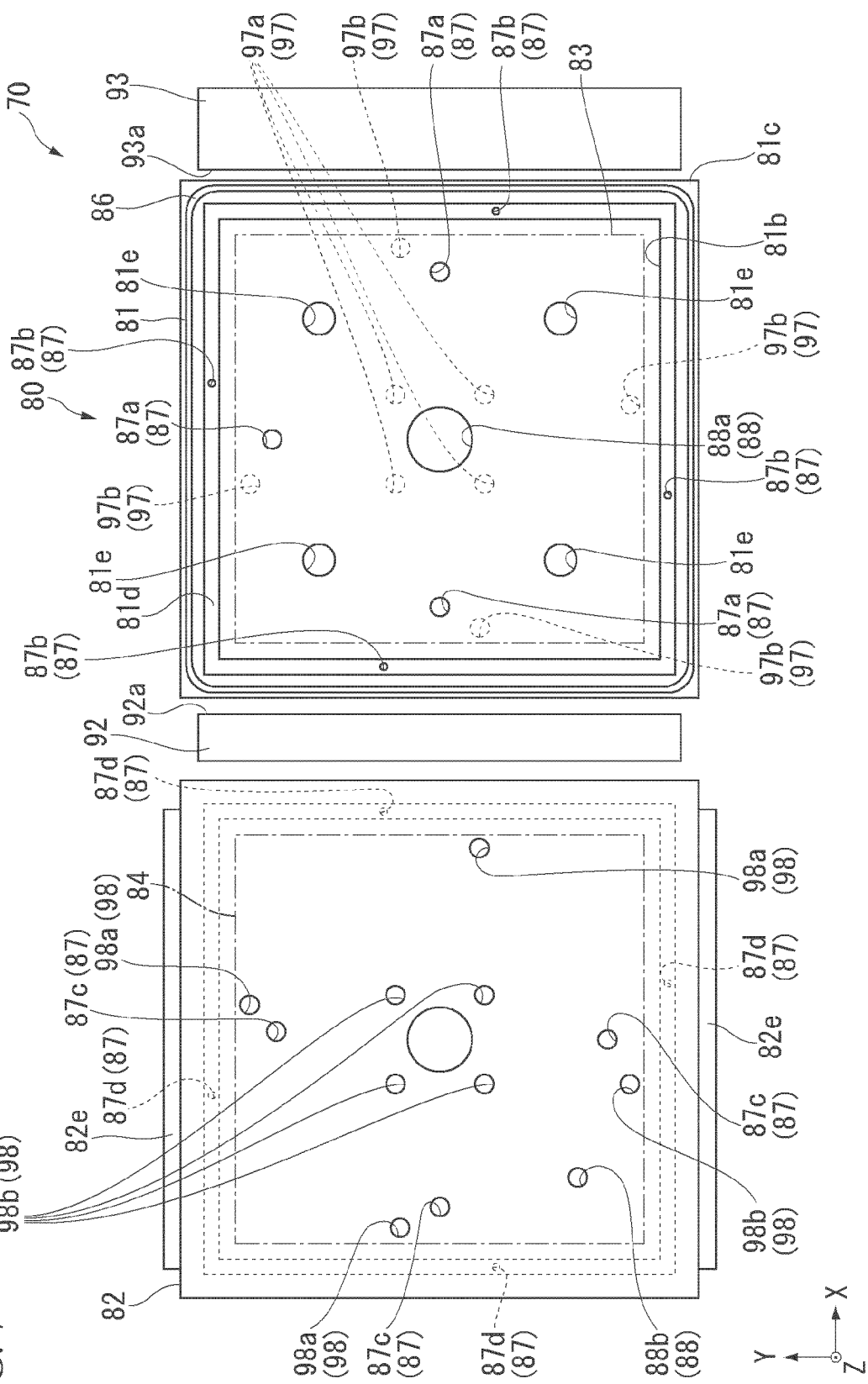
FIG. 7 A diagram showing a configuration of part of a baking part according to the present embodiment.

FIG. 7 is a diagram showing the state where the second accommodation part 82 has been moved in the X-direction, as viewed in the −Z-direction of the chamber apparatus 80. As shown in FIG. 6 and FIG. 7, by sliding the second accommodation part 82 in the −X-direction, the first accommodation part 81 and the second accommodation part 82 are displaced in the X-direction (illustrated by a dot-dash line in FIG. 6). In such a case, it becomes easy to access to the inside of the first accommodation part 81 and the inside of the second accommodation part 82, as compared to the state where the first accommodation part 81 and the second accommodation part 82 overlap as viewed in the Z-direction. As a result, the maintenance ability is improved.

The first accommodation part 81 has a bottom portion 81*a* and a side wall portion 81*b*. The bottom portion 81*a* is formed in a curve (curved portion) to protrude toward outside of the chamber apparatus 80 (−Z side). In the present embodiment, an example is shown in which the entire bottom portion of the first accommodation part 81 is formed to be curved, but the present invention is not limited to such configuration. For example, a portion of the bottom portion may be formed in a curve to protrude in toward the −Z side.

The side wall portion 81*b* is formed in a square tube which extends from a peripheral portion of the bottom portion 81*a* toward the +Z side. The end portion 81*c* on the +Z side of the first accommodation part 81 is formed at a position which surrounds the side wall portion 81*b* as viewed in the Z direction. The end portion 81*c* is formed to protrude from the side wall portion 81*b* toward outside the chamber apparatus 80. The side wall portion 81*b* and the end portion 81*c* are connected by a step portion 81*d*. The step portion 81*d* has a face parallel to the XY plane.

The bottom portion 81*a* has through-holes 81*e* which penetrate the bottom portion 81*a* in the Z direction. As shown in FIG. 7, four through-holes 81*e* are provided to surround a central portion of the first accommodation part 81 as viewed in the Z direction. Each of the four through-holes 81*e* is provided at a position between the central portion of the first accommodation part 81 and a corner portion of the first accommodation part 81. The through-holes 81*e* allow part of the lifting part 85 to penetrate therethrough.

Further, the first accommodation part 81 is provided with a cooling medium flow part 97.

The cooling medium flow part 97 allows a cooling medium for cooling the first accommodation part 81 to flow therethrough. Inside the first accommodation part 81, a flow path (not shown) for flowing the cooling medium is formed. The cooling medium flow part 97 has a supply part 97*a* which supplies a cooling medium to the flow path, and a discharge part 97*b* which discharges the cooling medium from the flow path. The supply part 97*a* is connected to a cooling medium supply source (not shown). A configuration may be used in which the temperature of the cooling medium discharged from the discharge part 97*b* is adjusted, and the cooling medium is returned to the supply part 97*a*. By recycling the cooling medium, the cooling medium can be used without waste.

On the other hand, the second accommodation part 82 has a ceiling portion 82*a* and a side wall portion 82*b*. The ceiling portion 82*a* is formed in a curve (curved portion) to protrude toward outside of the chamber apparatus 80 (−Z side). In the present embodiment, an example is shown in which the entire bottom portion of the second accommodation part 82 is formed to be curved, but the present invention is not limited to such configuration. For example, a portion of the bottom portion may be formed in a curve to protrude in toward the −Z side.

The side wall portion 82*b* is formed in a square tube which extends from a peripheral portion of the ceiling portion 82*a* toward the −Z side. Like the end portion 81*c* of the first accommodation part 81, the end portion 82*c* on the −Z side of the second accommodation part 82 is formed at a position which surrounds the side wall portion 82*b* as viewed in the Z direction. The end portion 82*c* is formed to protrude from the side wall portion 82*b* toward outside the chamber apparatus 80. The side wall portion 82*b* and the end portion 82*c* are connected by a step portion 82*d*. The step portion 82*d* has a face parallel to the XY plane.

On a +Y-side end face and a −Y-side end face of the second accommodation part 82, gas flow regulating plates 82*e* is provided. Each gas flow regulating plate 82*e* is formed in a rectangular plate, and for example, is formed to have a size capable of covering the side walls on +Y-side and −Y-side of the first accommodation part 81 and the second accommodation part 82 in a state where the chamber apparatus 80 is opened. Each gas flow regulating plate 82*e* is movable in the Z direction.

Further, the second accommodation part 82 is provided with a cooling medium flow part 98.

The cooling medium flow part 98 allows a cooling medium for cooling the second accommodation part 82 to flow therethrough. Like the first accommodation part 81, inside the second accommodation part 82, a flow path (not shown) for flowing the cooling medium is formed. The cooling medium flow part 98 has a supply part 98*a* which supplies a cooling medium to the flow path, and a discharge part 98*b* which discharges the cooling medium from the flow path. The supply part 98*a* is connected to a cooling medium supply source (not shown). A configuration may be used in which the temperature of the cooling medium discharged from the discharge part 98*b* is adjusted, and the cooling medium is returned to the supply part 98*a*. By recycling the cooling medium, the cooling medium can be used without waste.

In the above configuration, since the bottom portion 81*a* of the first accommodation part 81 and the ceiling portion 82*a* of the second accommodation part 82 are curved toward outside of the chamber apparatus 80, the pressure resistance of the chamber apparatus 80 in a closed state can be improved. Therefore, as compared to the case where the bottom portion 81*a* of the first accommodation part 81 and the ceiling portion 82*a* of the second accommodation part 82 are formed to be flat, it becomes possible to increase the pressure inside the chamber apparatus 80. The chamber apparatus 80 is resistant to a pressure of several atms (e.g., 3 atm).

The first heating plate 83 is accommodated in the first accommodation part 81. The first heating part 83 heats a substrate S in a state where the substrate S is mounted on the first heating part 83. The first heating plate 83 is formed of, for example, quartz or the like, and is provided with a heating device such as an infrared device or a hot plate inside thereof. As such a heating device, for example, an outer periphery heating part 83*a* and an inner periphery heating part 83*b* are provided inside the first heating plate 83. The outer periphery heating part 83*a* and the inner periphery heating part 83*b* are formed in the shape of a ring as viewed in the Z direction, and are disposed on an outer peripheral side and an inner peripheral side of the first heating plate 83, so as to be a double structure. Therefore, the first heating plate is uniformly heated over the entire surface. The temperature of the first heating plate 83 is adjustable, for example, from about 200 to 800° C. The first heating plate 83 is supported on the side wall portion 81*b* of the first accommodation part 81 by a supporting part 83*c*. The first heating plate 83 has a plurality of through-holes 83*d* formed thereon. The through-holes 83*d* allow part of the lifting part 85 to penetrate therethrough.

The second heating plate 84 is accommodated in the second accommodation part 82. The second heating plate 84 is formed of, for example, a metal material, and is provided with a heating device such as an infrared device or a hot plate inside thereof. As such a heating device, for example, like the first heating plate 83, an outer periphery heating part 84*a* and an inner periphery heating part 84b are provided inside the second heating plate 84. The outer periphery heating part 84a and the inner periphery heating part 84b are formed in the shape of a ring as viewed in the Z direction, and are disposed on an outer peripheral side and an inner peripheral side of the second heating plate 84, so as to be a double structure. Therefore, the second heating plate 84 is uniformly heated over the entire surface. The temperature of the second heating plate 84 is adjustable, for example, from about 200 to 800° C. The second heating plate 84 is provided to be movable independently from the second accommodation part 82 in the Z direction by a lifting mechanism (not shown). By moving the second heating plate 84 in the Z direction, the interval between the second heating plate 84 and the substrate S can be adjusted. The second heating plate 84 is supported on the side wall portion 82b of the second accommodation part 82 by a supporting part 84c.

The +Z-side face of the first heating plate 83 (the face which supports the substrate) and the −Z-side face of the second heating plate 84 are formed of a ground glass. By virtue of such configuration, heat transfer from the surface of the first heating plate 83 to the substrate mounted on the first heating plate 83 can be prevented. In addition, radiant heat can be utilized, thereby improving the heating efficiency. Further, by changing the polishing state of the face formed of ground glass, the transmission of light to the substrate S can be controlled.

The lifting part 85 moves the substrate S between the arm part 71 and the first heating plate 83. The lifting part 85 has a plurality of support pins 85a and a moving part 85b which is movable in the Z direction while holding the support pins 85a. For easier discrimination of the drawings, in FIG. 7, a configuration is shown in which two support pins 85a are provided. However, in practice, it is possible to provide, for example, four support pins 85a (see FIG. 7). The plurality of through-holes 83d provided on the first heating plate 83 are arranged at positions corresponding to the plurality of support pins 85a as viewed in the Z direction. Each support pin 85a is configured to support the peripheral portion of the substrate S (a position of about several mm from the outer periphery).

The sealing part 86 is formed on the end portion 81c of the first accommodation part 81. As the sealing part 86, for example, an O-ring formed by a resin material or the like can be used. The sealing part 86 seals the first accommodation part 81 and the second accommodation part 82 in a state where the end portion 82c of the second accommodation part 82 is superimposed on the first end portion 81c of the first accommodation part 81. In this manner, the inside of the first accommodation part 81 and the second accommodation part 82 can be closed. A cooling mechanism for water-cooling the O-ring can be separately provided.

The gas supply part 87 supplies a nitrogen gas, an oxygen gas, an argon gas, air and the like to the inside of the chamber apparatus 80, so as to control the atmosphere and the pressure inside the chamber apparatus 80. The gas supply part 87 has a bottom portion gas supply part 87a and a step portion gas supply part 87b provided on the first accommodation part 81, and a ceiling gas supply part 87c and a step portion gas supply part 87d provided on the second accommodation part 82.

For example, three bottom portion gas supply parts 87a are provided on the bottom portion 81a of the first accommodation part 81. The three bottom portion gas supply parts 87a are arranged on the +X side, the −X side and the +Y side on the central portion of the first accommodation part 81, as viewed in the Z direction. The bottom portion gas supply parts 87a are capable of supplying the same type of gas or different types of gases.

For example, four step portion gas supply parts 87b are provided on the step portion 81d of the first accommodation part 81. With respect to the step portion supply parts 87b, one step portion supply part 87b is provided on each edge of the step portion 81d formed in a rectangular ring as viewed in the Z direction. Each step portion gas supply part 87b is provided at a position displaced from the central portion of each edge of the step portion 81d.

The step portion supply part 87b has a gas flow tube formed to penetrate through the first accommodation part 81, and a gas supply source (not shown) connected to the gas flow tube. The step portion 81d is provided with an opening. The end portion of the gas flow tube is connected to the opening. The step portion gas supply part 87b is capable of supplying a gas around the first heating plate 83 via the gas flow tube.

For example, three ceiling gas supply part 87c can be provided on the ceiling portion 82a of the second accommodation part 82. The three ceiling gas supply parts 87c are arranged on the +X side, the −X side and the +Y side on the central portion of the second accommodation part 82, as viewed in the Z direction.

For example, four step portion gas supply parts 87d are provided on the step portion 82d of the second accommodation part 82. With respect to the step portion supply parts 87d, one step portion supply part 87d is provided on each edge of the step portion 82d formed in a rectangular ring as viewed in the Z direction. Each step portion gas supply part 87d is provided at a position displaced from the central portion of each edge of the step portion 82d. The step portion gas supply part 87d is capable of supplying a gas around the second heating plate 84.

As the gas supply source for each part of the gas supply part 87, a gas bomb or a gas pipe can be used. A configuration in which a plurality of gas sources are provided and each gas source is switchable can be used. By such a configuration, one type of or a plurality of types of gases can be selectively supplied to the inside of the chamber apparatus 80. Examples of the gas supplied from the gas supply part 87 include a reaction promoter gas such as an inert gas (e.g., a nitrogen gas, an argon gas or the like) or a sulfur-containing gas (hydrogen sulfide); a hydrogen-containing gas (a hydrogen gas); an oxygen gas; and air. Alternatively, a configuration in which water is supplied in the form of a mist can be used.

The discharge part 88 suctions inside of the chamber apparatus 80, and discharges the gas inside the chamber apparatus 80. The discharge part 88 has a bottom portion discharge part 88a provided on the first accommodation part 81, and a ceiling discharge part 88b provided on the second accommodation part 82. As the suction source of the discharge part 88, for example, a pump can be used.

The bottom portion discharge part 88a is provided at a central portion of the bottom portion 81a of the first accommodation part 81, as viewed in the Z direction. The bottom portion discharge part 88a is capable of efficiently discharging a gas heavier than air. Further, one ceiling discharge part 88b is provided on the ceiling portion 82a of the second accommodation part 82. The ceiling discharge part 88b is provided, for example, at a position displaced in the −X direction and the −Y direction from the central portion of the second accommodation part 82, as viewed in the Z direction. The ceiling discharge part 88b is capable of efficiently discharging a gas lighter than air (such as hydrogen).

The amount of gas supplied from the gas supply part 87 and the amount of gas discharged from the discharge part 88 can be controlled, for example, by a mass flow controller (MFC; not shown). The MFC can be provided, for example, in the glove part GX2 of the second chamber CB2 (see FIG. 1).

The first heat insulation part 89 is provided between the first heating plate 83 and the bottom portion 81*a* of the first accommodation part 81, as viewed in the Z direction. The first heat insulation part 89 suppresses the heat of the first heating plate 83 from being conducted to the bottom portion 81*a*. The first heat insulation 89 part is supported, for example, by a supporting member connected to a side portion of the first accommodation part 81. The first heat insulation part 89 is arranged with intervals so that it does not come into contact with the first heating plate 83 and the bottom portion 81*a*.

The second heat insulation part 90 is provided between the second heating plate 84 and the ceiling portion 82*a* of the second accommodation part 82, as viewed in the Z direction. The second heat insulation part 90 suppresses the heat of the second heating plate 84 from being conducted to the ceiling portion 82*a*. Like the first heat insulation part 89, the second heat insulation part 90 is supported, for example, by a supporting member connected to a side portion of the second accommodation part 82. The second heat insulation part 90 is arranged with intervals so that it does not come into contact with the second heating plate 84 and the ceiling portion 82*a*.

The first heat insulation part 89 and the second heat insulation part 90 are formed in a rectangle, as viewed in the Z direction. The first heat insulation part 89 and the second heat insulation part 90 have a configuration in which a plurality of plate members made of SUS or the like are stacked. Each plate member is configured to have a thickness (stacking direction: dimension in the Z direction) of about 1 mm.

The gas flow part 91 has a gas ejection part 92, a suction part 93 and a circulation part 94 (circulation path 94). The gas flow part 91 allows a gas for controlling the temperature (temperature-control gas) between the first accommodation part 81 and the second accommodation part 82.

The gas ejection part 92 is disposed on the −X side of the chamber apparatus 80. The gas ejection part 92 has an ejection opening 92*a* directed toward the chamber apparatus 80. Specifically, the ejection opening 92*a* is formed on a plane of the gas ejection part 92 in parallel to the YZ plane, and is directed to the +X direction. The gas ejection opening 92 is capable of ejecting a gas from the ejection opening 92*a* in the +X direction.

As shown in FIG. 6, the gas ejection opening 92 can be lifted up or down between the waiting position P1 and the ejection position P2 in the Z direction by a lifting unit (not shown). The waiting position P1 may be, for example, a position where the upper end (+Z side end portion) of the gas ejection part 92 is configured to be on the −Z side with respect to the end portion 81*c* of the first accommodation part 81. By such a configuration, even in the case where the gas ejection part 92 is arranged at the waiting position P1, the loading/unloading operation of the substrate in the chamber apparatus 80 can be conducted.

Further, for example, as illustrated by a dash-dot line in FIG. 6, the ejection position P2 may be a position where the ejection opening 92*a* of the gas ejection part 92 is directed to a space between the first accommodation part 81 and the second accommodation part 82 when the chamber apparatus 80 is in an open state. In such a case, when a gas is ejected from the ejection opening 92*a* of the gas ejection part 92 disposed at the ejection position P2 in the state where the chamber apparatus 80 is opened, the ejected gas is blown between the first heating plate 83 and the second heating plate 84.

The suction part 93 is disposed on the +X side of the chamber apparatus 80. Thus, in the X direction, the chamber apparatus 80 is disposed between the gas ejection part 92 and the suction part 93. The suction part 93 has a suction opening 93*a* directed to the chamber apparatus 80. Specifically, the suction opening is arranged so as to be directed to a space between the first accommodation part 81 and the second accommodation part 82 when the chamber apparatus 80 is in an open state. Thus, for example, by operating both the gas ejection part 92 and the suction part 93 when the chamber apparatus 80 is in an open state, the gas ejected from the gas ejection part 92 is blown through the space between the first heating plate 83 and the second heating plate 84 in the +X direction and suctioned by the suction part 93.

The gas which moves through the space between the first heating plate 83 and the second heating plate 84 in the +X direction absorbs the heat of the first heating plate 83, the second heating plate 84 and the space therebetween (including the substrate mounted on the first heating plate; the same applies herebelow) and moves to the suction part 93. As such, the first heating plate 83, the second heating plate 84 and the space therebetween are cooled by the movement of the gas.

The circulation part 94 supplied the gas suctioned by the suction part 93 to the gas ejection part 92. The circulation part 94 has a first pipe 94*a*, a radiator 94*b*, a second pipe 94*c*, a blower 94*d*, a third pipe 94*e*, a filter 94*f* and a fourth pipe 94*g*. The first pipe 94*a* connects the suction part 93 with the radiator 94*b*. The radiator 94*b* cools the gas suctioned by the suction part 93. The second pipe 94*c* connects the radiator 94*b* with the blower 94*d*. The blower 94*d* transfers the gas from the suction part 93 to the gas ejection part 92. In the gas flow part 91, the blower 94*d* functions as the driving source of the gas. The third pipe 94*e* connects the blower 94*d* with the filter 94*f*. The filter 94*f* removes foreign matters from the gas transferred from the third pipe 94*e* to the fourth pipe 94*g*. The fourth pipe 94*g* connects the filter 94*f* with the gas ejection part 92.

In such a configuration, the gas suctioned by the suction part 93 is cleaned and cooled by the circulation part 94, and then supplied to the gas ejection part 92. Therefore, the gas ejected from the gas ejection part 92 can efficiently absorb the heat of the first heating plate 83, the second heating plate 84 and the space therebetween. As a result, the cooling efficiency can be improved. A heat exchanger may be provided between the suction part 93 and the radiator 94*b* (e.g., in the first pipe 94*a*).

Further, in the present embodiment, solvent concentration sensors SR3 and SR4 are provided. Like the aforementioned solvent concentration sensors SR1 and SR2, the solvent concentration sensors SR3 and SR4 detects the concentration of the solvent (in the present embodiment, hydrazine) for the liquid material in the ambient atmosphere, and sends the detection results to the control part CONT. The solvent concentration sensor SR3 is provided on the platform 74 on the +Y side of the heating part 70 within the treatment room 60*a*. The solvent concentration sensor SR3 is provided at a position remote from the heating part 70. The solvent concentration sensor SR4 is provided outside the second chamber CB2. In the present embodiment, for detecting the concentration of hydrazine which has a larger specific gravity than air, like the solvent concentration sensors SR1 and SR2, the solvent concentration sensors SR3 and SR4 are disposed on the lower side of the transport path of the substrate S in the vertical direction. Further, by providing a solvent concentration sensor SR4 outside the second chamber CB2, it becomes possible to detect leakage of hydrazine from the second chamber CB2.

(Substrate Transport Path)

The second opening 12 of the substrate loading/unloading part LU, the first opening 21 and the second opening 22 of the coating part CT, the first opening 51 and the second opening 52 of the vacuum drying part VD and the opening 61 of the baking part BK are provided along a line in parallel to the X-direction. Thus, the substrate S is moved along a line in the X-direction. Further, in the path from the substrate loading/unloading part LU to the heating part 70 of the baking part BK, the position in the Z-direction is maintained. Thus, stirring of the gas around the substrate S can be suppressed.

(Anti-Chamber)

As shown in FIG. 1, the first chamber CB1 has anti-chambers AL1 to AL3 connected thereto.

The anti-chambers AL1 to AL3 are provided to communicate with the inside and outside of the first chamber CB1. Each of the anti-chambers AL1 to AL3 is a path through which a component of the treatment room 20a is taken out of the first chamber CB1 or the component is placed into the treatment room 20a from outside the first chamber CB1.

The anti-chamber AL1 is connected to the ejection part 31. The nozzle NZ provided in the ejection part 31 can be taken out of or placed into the treatment room 20a via the anti-chamber AL1. The anti-chamber AL2 is connected to the liquid material supply part 33. The liquid material supply part 33 can be taken out of or placed into the treatment room 20a via the anti-chamber AL2.

The anti-chamber AL3 is connected to a liquid material preparation part 36. In the liquid material preparation part 36, a liquid can be taken out of or placed into the treatment room 20a via the anti-chamber AL3. The anti-chamber AL3 is formed to have a size which allows the substrate S to pass through. Therefore, for example, when a test coating of the liquid material is to be conducted in the coating part CT, a substrate S prior to treatment can be supplied to the treatment room 20a from the anti-chamber AL3. Further, the substrate S after the test coating can be taken out from the anti-chamber AL3. Moreover, the substrate S can be taken out from the anti-chamber AL3 temporarily in emergency.

The second chamber CB2 has an anti-chamber AL4 connected thereto.

The anti-chamber AL4 is connected to the heating part 70. The anti-chamber AL4 is formed to have a size which allows the substrate S to pass through. Therefore, for example, when heating of the substrate S is to be conducted in the heating part 70, the substrate S can be supplied to the treatment room 60a from the anti-chamber AL4. Further, the substrate S after the heat treatment can be taken out from the anti-chamber AL4.

(Glove Part)

As shown in FIG. 1, the first chamber CB1 has a glove part GX1 connected thereto. Further, the second chamber CB2 has a glove part GX2 connected thereto.

The glove parts GX1 and GX2 are parts where an operator accesses the inside of the first chamber CB1 and the second chamber CB2. By inserting the hands inside the glove parts GX1 and GX2, the operator can conduct maintenance inside the first chamber CB1 and the second chamber CB2. The glove parts GX1 and GX2 are formed to have a bag-like shape. The glove parts GX1 and GX2 are respectively provided at a plurality of portions on the first chamber CB1 and the second chamber CB2. A sensor may be provided inside the first chamber CB1 and the second chamber CB2 which detects whether or not an operator has put his hand in the glove part GX1 or GX2.

(Gate Valve)

Between the second opening 12 of the substrate loading/unloading part LU and the first opening 21 of the coating part CT, a gate valve V1 is provided. The gate valve V1 is provided to be movable in the Z-direction by an actuator (not shown). By moving the gate valve V1 in the Z-direction, the second opening 12 of the substrate loading/unloading part LU and the first opening 21 of the coating part CT are simultaneously opened or closed. When the second opening 12 and the first opening 21 are simultaneously opened, a substrate S can be moved through the second opening 12 and the first opening 21.

Between the second opening 22 of the first chamber CB1 and the first opening 51 of the third chamber CB3, a gate valve V2 is provided. The gate valve V2 is provided to be movable in the Z-direction by an actuator (not shown). By moving the gate valve V2 in the Z-direction, the second opening 22 of the first chamber CB1 and the first opening 51 of the third chamber CB3 are simultaneously opened or closed. When the second opening 22 and the first opening 51 are simultaneously opened, a substrate S can be moved through the second opening 22 and the first opening 51.

Between the second opening 52 of the third chamber CB3 and the opening 61 of the second chamber CB2, a gate valve V3 is provided. The gate valve V3 is provided to be movable in the Z-direction by an actuator (not shown). By moving the gate valve V3 in the Z-direction, the second opening 52 of the third chamber CB3 and the opening 61 of the second chamber CB2 are simultaneously opened or closed. When the second opening 52 and the opening 61 are simultaneously opened, a substrate S can be moved through the second opening 52 and the opening 61.

(Control Device)

The control part CONT is a part which has the overall control of the coating apparatus CTR. Specifically, the control part CONT controls the operations of the substrate loading/unloading part LU, the coating part CT, the vacuum drying part VD, the baking part BK and the gate valves V1 to V3. As an example of the adjusting operation, the control part CONT controls the amount of gas to be supplied from the gas supply part 37a, based on the detection results of the solvent concentration sensors SR1 to SR4. The control part CONT has a timer or the like (not shown) for measuring the treatment time.

(Coating Method)

Next, a coating method according to one embodiment of the present invention will be described. In this embodiment, a coating film is formed on the substrate S by using the coating apparatus CTR having the above-described configuration. The operations performed by the respective parts of the coating apparatus CTR are controlled by the control part CONT.

Firstly, the control part CONT loads a substrate S on the substrate loading/unloading part LU from the outside. In this case, the control part CONT closes the gate valve V1, opens the lid portion 14 and accommodates the substrate S in the accommodation room 10a of the chamber 10. After the substrate S is accommodated in the accommodation room 10a, the control part CONT closes the lid portion 14.

After the lid portion 14 is closed, the control part CONT opens the gate valve V1, so as to communicate the accommodation room 10a of the chamber 10 with the treatment room 20a of the first chamber CB1 of the coating part CT. After opening the gate valve V1, the control part CONT transports the substrate S in the X-direction using the substrate transporting part 15.

After a portion of the substrate S has been inserted into the treatment room 20a of the first chamber CB1, the control part CONT uses the substrate transporting part 25 to completely load the substrate S into the treatment room 20a. After the substrate S has been loaded, the control part CONT closes the gate valve V1. After closing the gate valve V1, the control part CONT transports the substrate S to the treatment stage 28.

Figure 8:
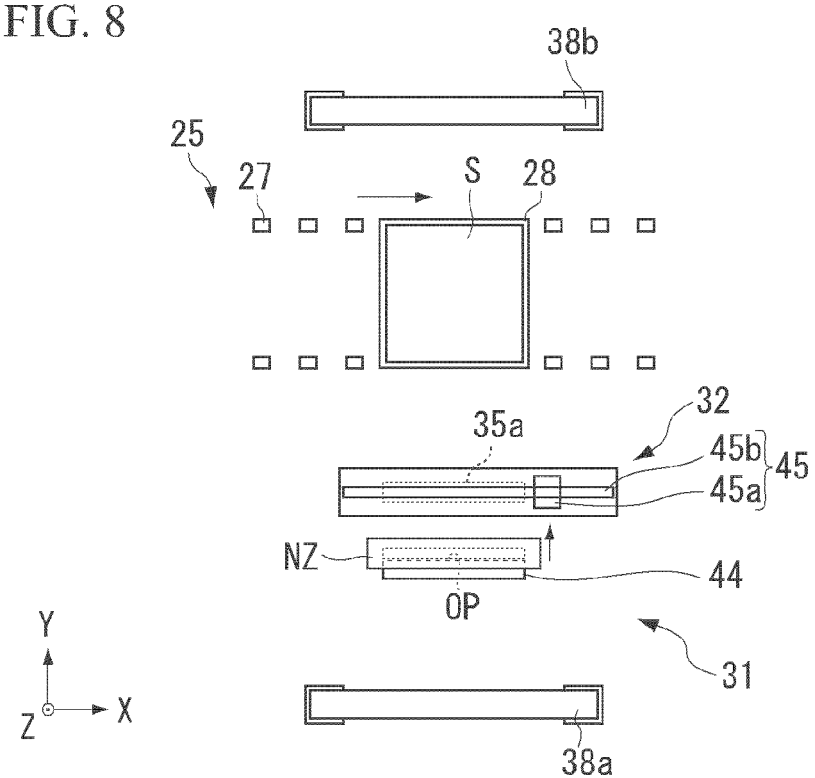
FIG. 8 A diagram showing a step in a coating treatment performed by a coating apparatus according to the present embodiment.

FIG. 8 is a diagram showing a simplified configuration of the coating part CT in which part of the components have been abbreviated. Herebelow, the same applies to FIG. 9 to FIG. 12. As shown in FIG. 8, when the substrate S is mounted on the treatment stage 28, a coating treatment is conducted by the coating part CT. Prior to the coating treatment, the control part CONT closes the gate valves V1 and V2, and conducts supplying and suctioning of an inert gas using the gas supplying part 37a and the gas exhaust part 37b.

By this operation, the atmosphere and the pressure of the treatment room 20a can be adjusted. After adjusting the atmosphere and the pressure of the treatment room 20a, the control part CONT uses the nozzle actuator NA (not shown in FIG. 8) to move the nozzle NZ from the nozzle standby part 44 to the nozzle-tip control part 45. Thereafter, during the coating treatment, the control part CONT continuously conducts the adjusting operation of the atmosphere and the pressure of the treatment room 20a.

Figure 9:
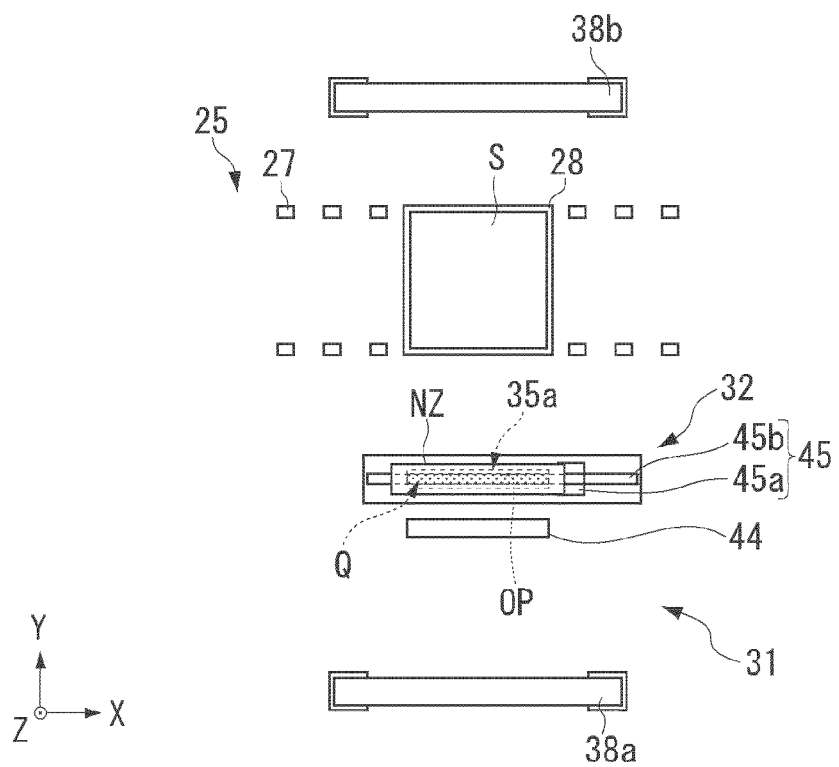
FIG. 9 A diagram showing a step in a coating treatment performed by a coating apparatus according to the present embodiment.
Figure 10:
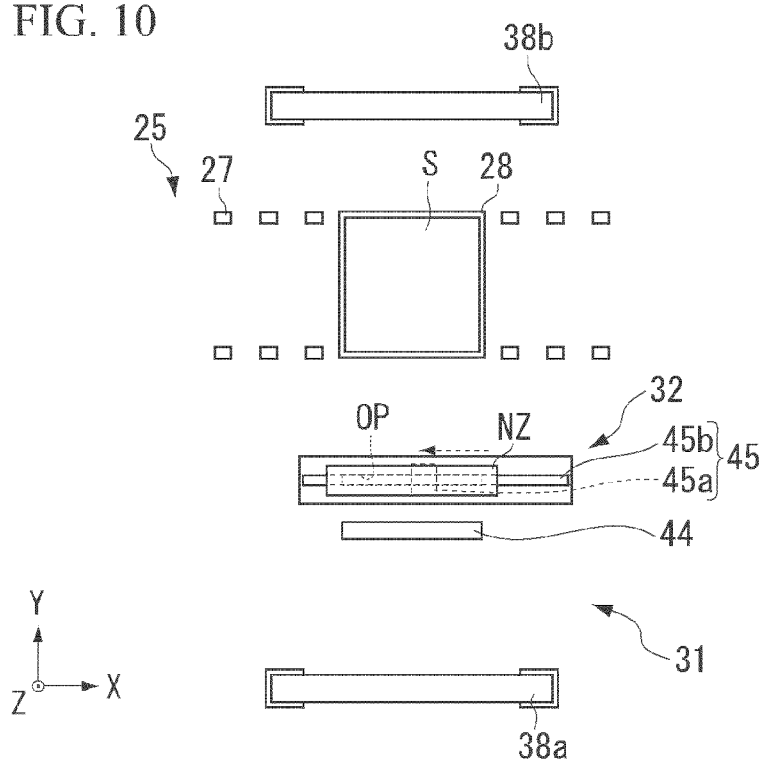
FIG. 10 A diagram showing a step in a coating treatment performed by a coating apparatus according to the present embodiment.

When the nozzle NZ reaches the nozzle-tip control part 45, as shown in FIG. 9, the control part CONT conducts a preliminary ejection operation of the nozzle NZ. In the preliminary ejection operation, the control part CONT ejects the liquid material Q from the ejection opening OP. After the preliminary ejection operation, as shown in FIG. 10, the control part CONT moves the wiping part 45a along the guide rail 45b in the X-direction, so as to wipe the tip TP of the nozzle NZ and the inclined part in the vicinity thereof.

Figure 11:
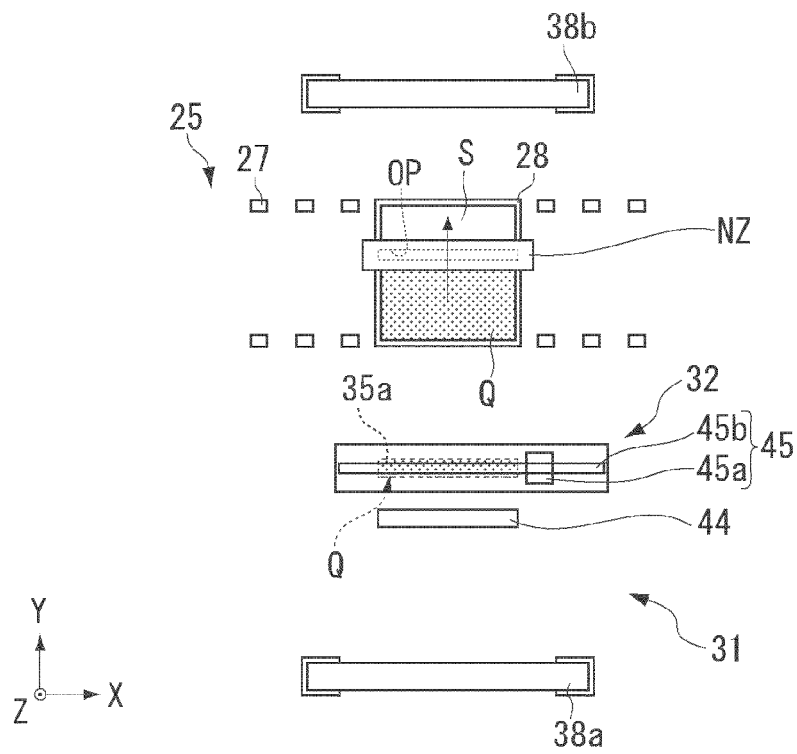
FIG. 11 A diagram showing a step in a coating treatment performed by a coating apparatus according to the present embodiment.
Figure 12:
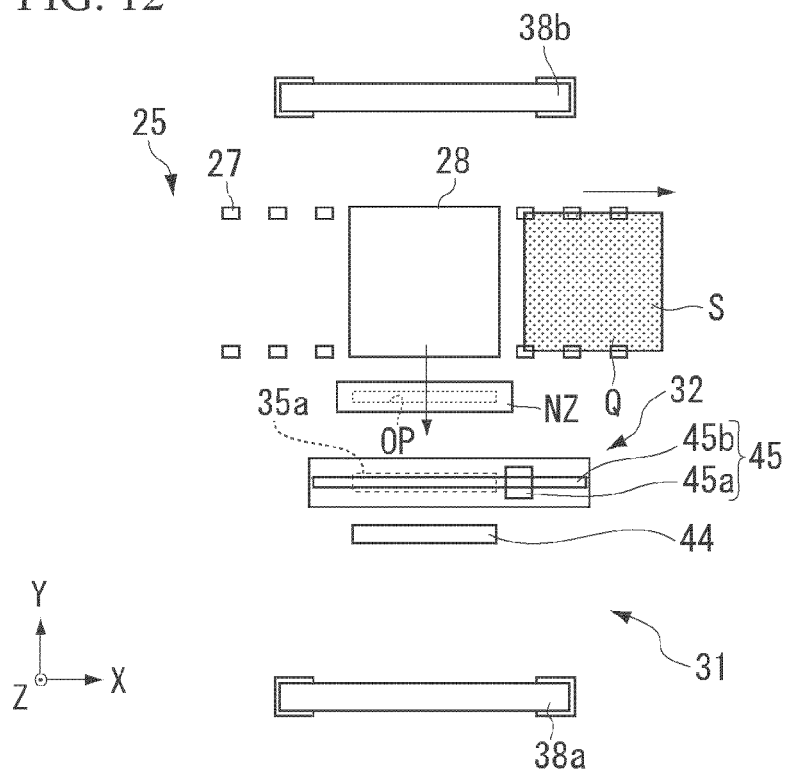
FIG. 12 A diagram showing a step in a coating treatment performed by a coating apparatus according to the present embodiment.

After wiping the tip TP of the nozzle NZ, the control part CONT moves the nozzle NZ to the treatment stage 28. After the ejection opening OP of the nozzle NZ reaches the −Y-side end of the substrate S, as shown in FIG. 11, the control part CONT ejects the liquid material Q from the ejection opening OP to the substrate S while moving the nozzle NZ in the +Y-direction at a predetermined speed. By this operation, a coating film F of the liquid material Q is formed on the substrate S.

After forming a coating film of the liquid material Q on a predetermined region of the substrate S, the control part CONT uses the substrate transporting part 25 to move the substrate S from the treatment stage 28 to the second stage 26B in the +X-direction. Further, the control part CONT moves the nozzle NZ in the −Y-direction, and returns the nozzle NZ to the nozzle standby part 44.

Figure 13:
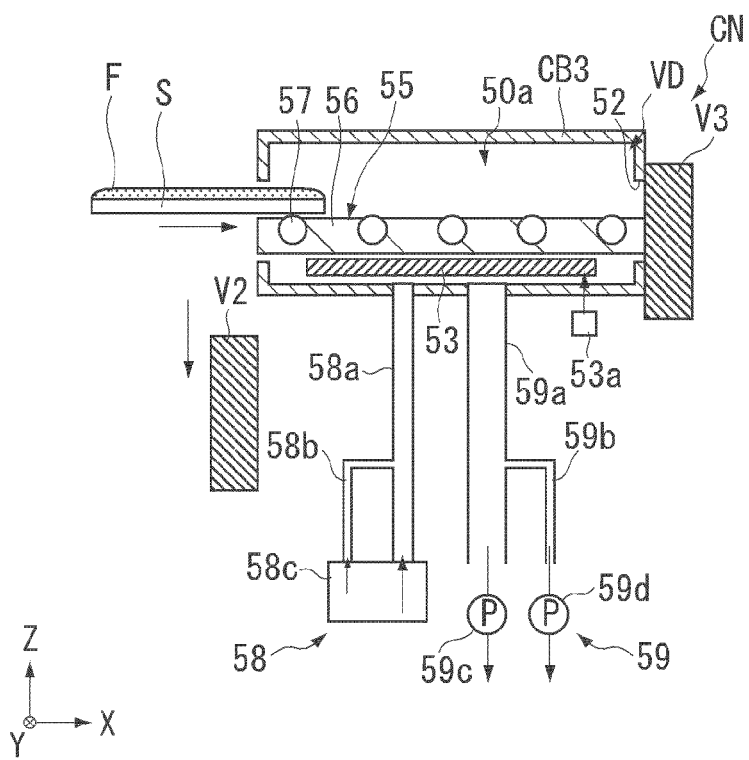
FIG. 13 A diagram showing a step in a vacuum drying treatment performed by a coating apparatus according to the present embodiment.
Figure 14:
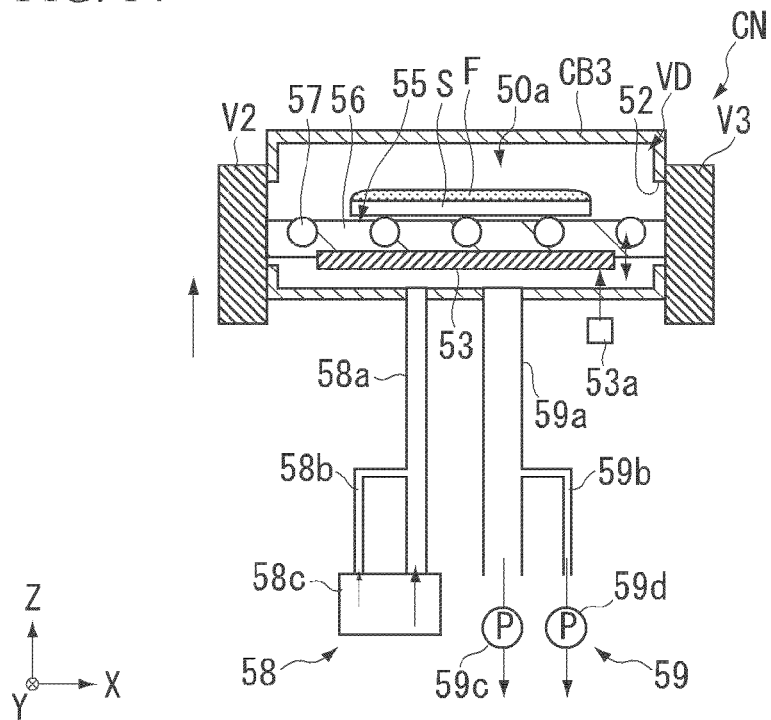
FIG. 14 A diagram showing a step in a vacuum drying treatment performed by a coating apparatus according to the present embodiment.

When the substrate S reaches the second opening 22 of the first chamber CB1, as shown in FIG. 13, the control part CONT opens the gate valve V2, and transports the substrate S from the first chamber CB1 to the second chamber CB2 (transporting step). In the transporting step, the substrate S passes through the third chamber CB3 disposed at the connection part CN. When the substrate S passes through the third chamber CB3, the control part CONT conducts a drying treatment of the substrate S using the vacuum drying part VD. Specifically, after the substrate S is accommodated in the treatment room 50a of the third chamber CB3, as shown in FIG. 14, the control part CONT closes the gate valve V2.

Figure 15:
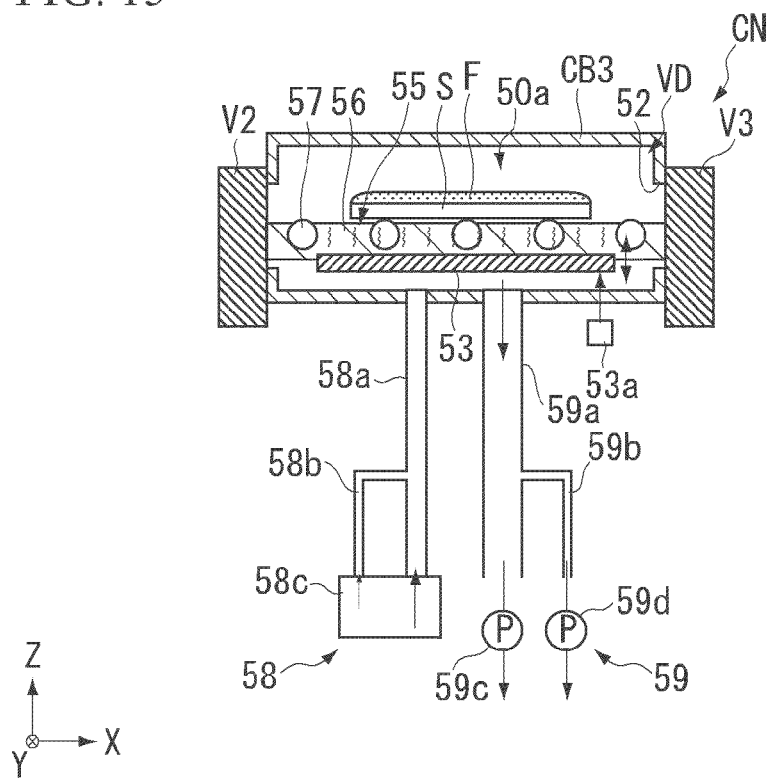
FIG. 15 A diagram showing a step in a vacuum drying treatment performed by a coating apparatus according to the present embodiment.

After closing the gate valve V2, the control part CONT uses the lifting mechanism 53a to adjust the position of the heating part 53 in the Z-direction. Thereafter, as shown in FIG. 15, the control part CONT uses the gas supply part 58 to adjust the atmosphere inside the treatment room 50a and uses the gas exhaust part 59 to reduce the pressure inside the treatment room 50a. When the pressure inside the treatment room 50a is reduced by this operation, evaporation of the solvent contained in the coating film of the liquid material Q formed on the substrate S is promoted, and the coating film is dried. The control part CONT may adjust the position of the heating part 53 in the Z-direction using the lifting mechanism 53a while reducing the pressure inside the treatment room 50a using the gas exhaust part 59.

Further, as shown in FIG. 15, the control part CONT uses the heating part 53 to heat the coating film F on the substrate S. By this operation, evaporation of the solvent contained in the coating film F on the substrate S is promoted, so that the vacuum drying treatment can be conducted in a short time. The control part CONT may adjust the position of the heating part 53 in the Z-direction using the lifting mechanism 53a while conducting the heating operation by the heating part 53.

Figure 16:
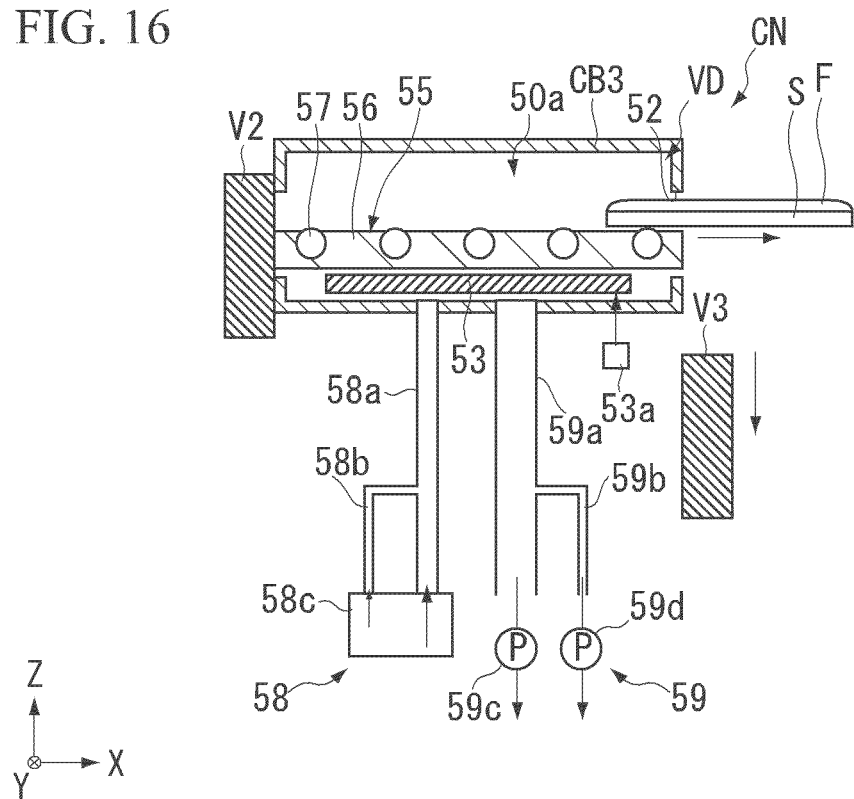
FIG. 16 A diagram showing a step in a vacuum drying treatment performed by a coating apparatus according to the present embodiment.

After the vacuum drying treatment, as shown in FIG. 16, the control part CONT opens the gate valve V3, and transports the substrate S from the connection part CN to the second chamber CB2. After the substrate S is accommodated in the treatment room 60a of the second chamber CB2, the control part CONT closes the gate valve V3.

Figure 17:
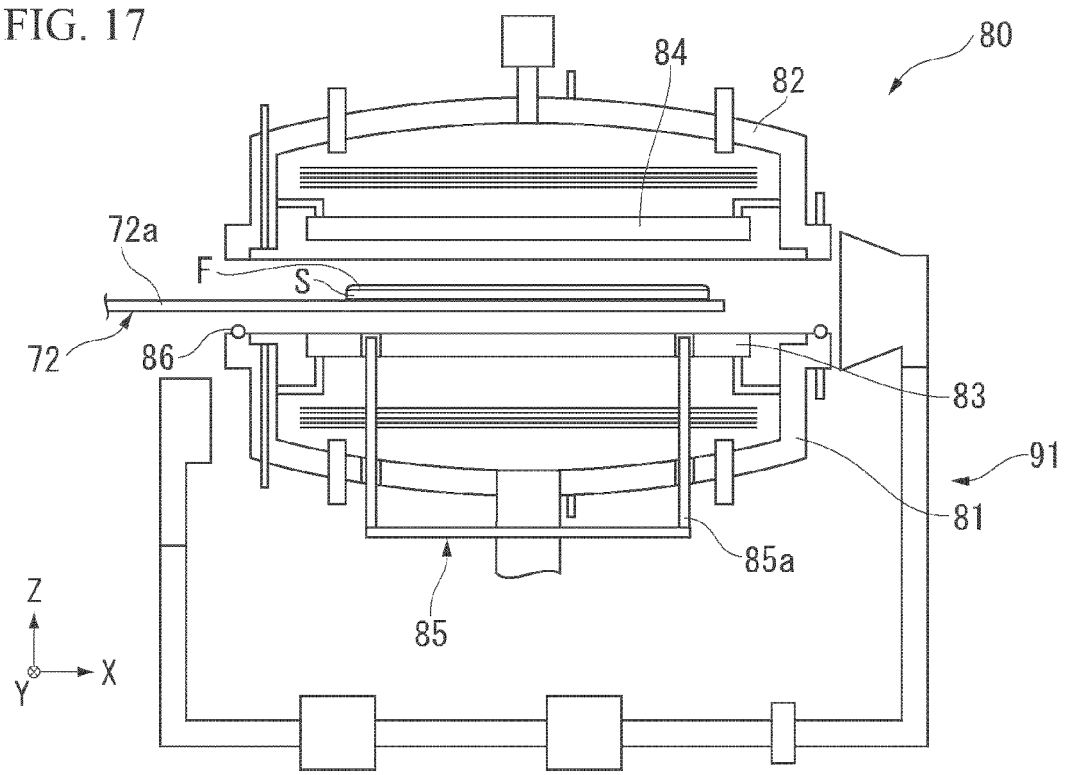
FIG. 17 A diagram showing a step in a baking treatment performed by a coating apparatus according to the present embodiment.
Figure 18:
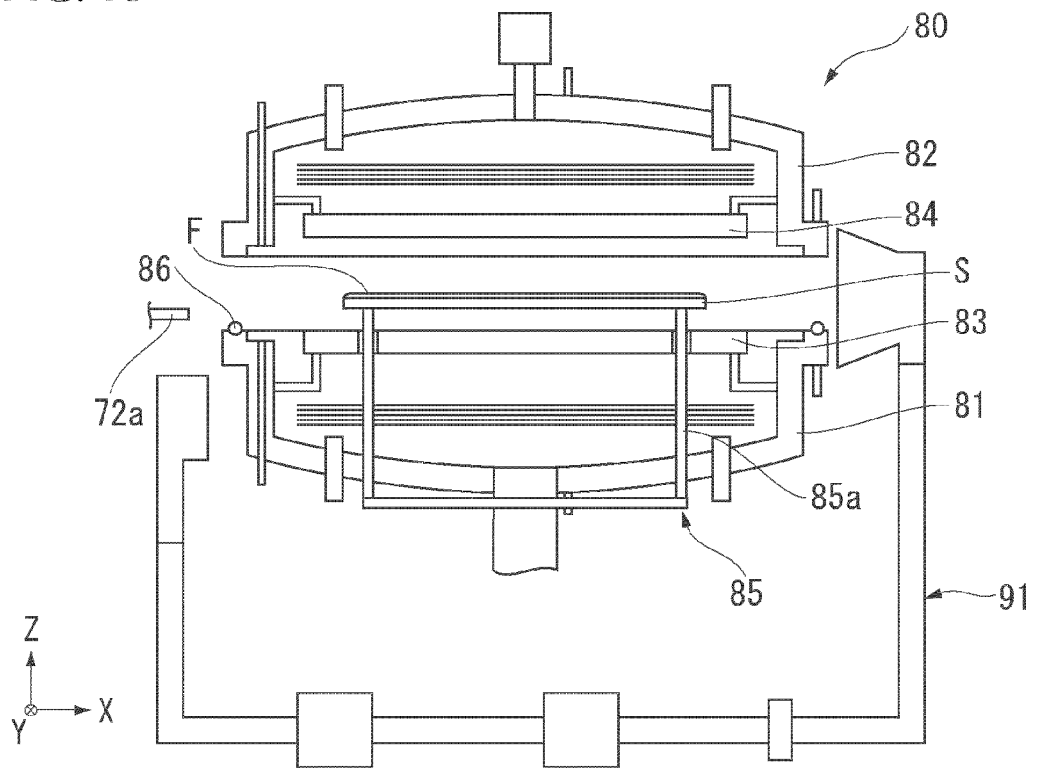
FIG. 18 A diagram showing a step in a baking treatment performed by a coating apparatus according to the present embodiment.

As shown in FIG. 17, by the movement of the substrate supporting part 72a, the substrate S is disposed above a central portion of the first heating plate 83. Thereafter, as shown in FIG. 18, the control part CONT moves the lifting part 85 in the +Z direction. By this operation, the substrate S leaves the substrate supporting part 72a of the transport arm 72, and is supported by the plurality of support pins 85a of the lifting part 85. In this manner, the substrate S is delivered from the substrate supporting part 72a to the lifting part 85. After the substrate S has been supported by the support pins 85a of the lifting part 85, the control part CONT withdraws the substrate supporting part 72a outside the chamber apparatus 80 in the −X direction.

Figure 19:
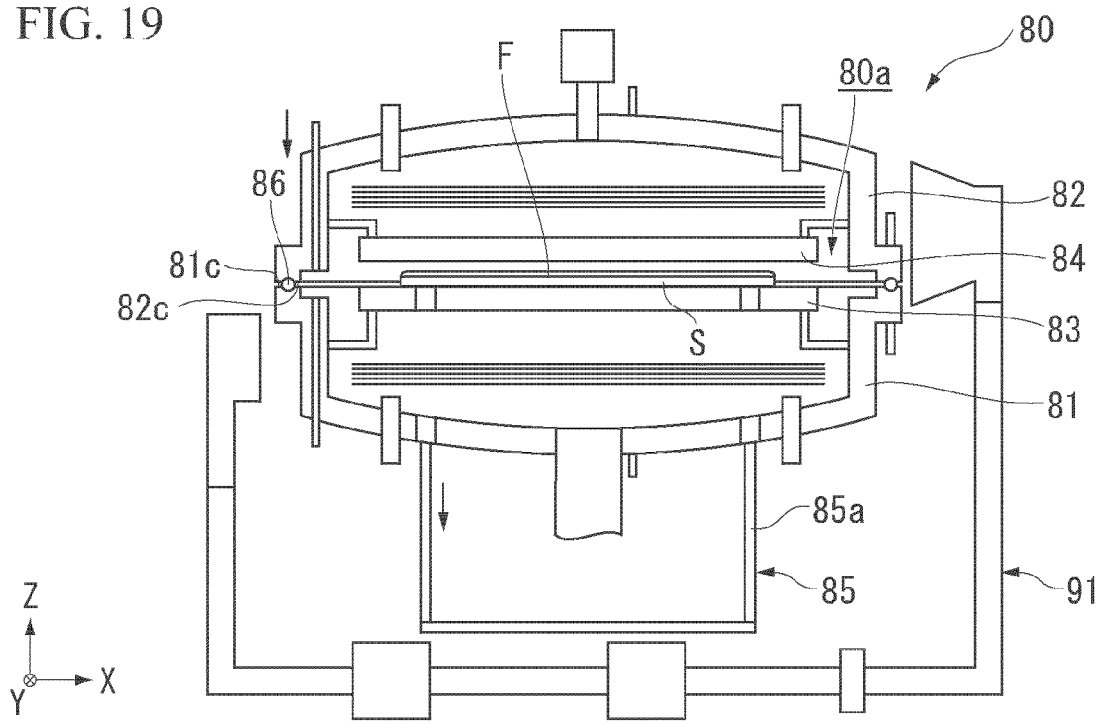
FIG. 19 A diagram showing a step in a baking treatment performed by a coating apparatus according to the present embodiment.

After withdrawing the substrate supporting part 72a, as shown in FIG. 19, the control part CONT moves the lifting part 85 in the −Z direction, mounts the substrate S on the first heating plate 83, and also moves the second accommodation part 82 in the −Z direction. By this operation, the end portion 82c of the second accommodation part 82 is superimposed on the end portion 81c of the first accommodation part 81, so that the sealing part 86 is sandwiched between the end portion 82c and the end portion 81c. As a result, a closed baking room 80a is formed by the first accommodation part 81, the second accommodation part 82 and the sealing part 86.

Figure 20:
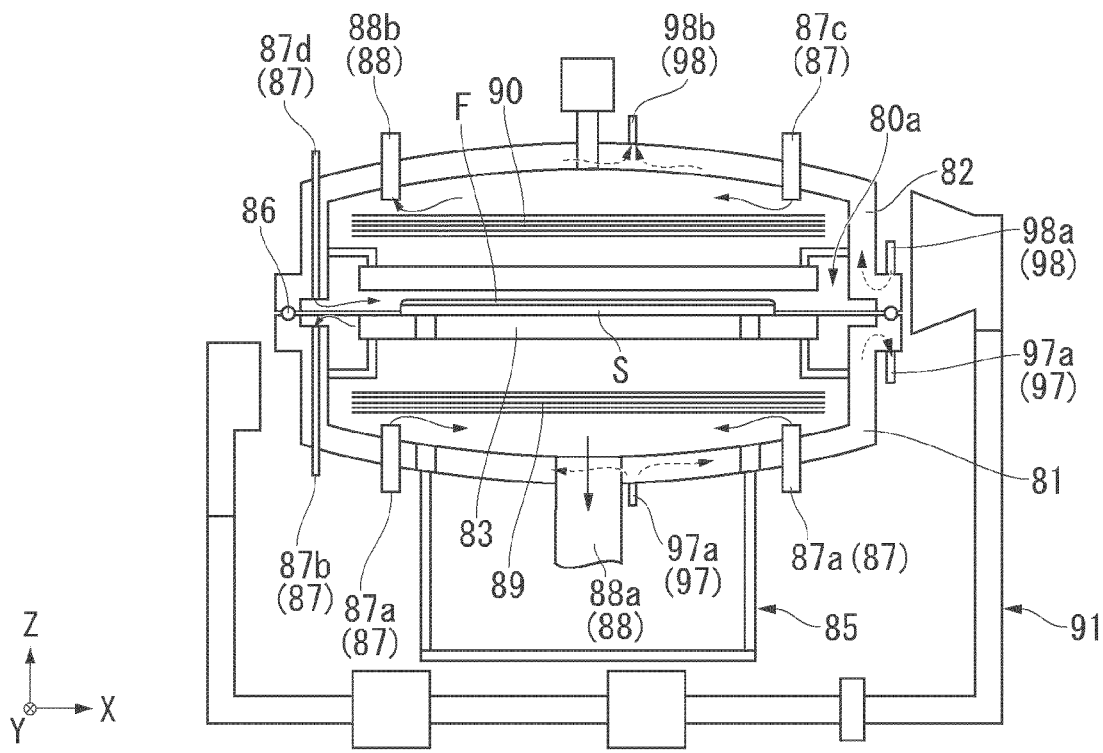
FIG. 20 A diagram showing a step in a baking treatment performed by a coating apparatus according to the present embodiment.

After forming the baking room 80a and mounting the substrate S on the first heating plate 83, as shown in FIG. 20, the control part CONT rises the temperature of the first heating plate 83 and the second heating plate 84, so as to bake the substrate S (heating step). In the heating step, for example, the solvent remaining in the coating film F is vaporized, and the coating film F is agglomerated to remove bubbles contained in the coating film F. Since the first heating plate 83 and the second heating plate 84 is provided with a heating device dually arranged on the outer side and the inner side, the entire surface is uniformly heated, and hence, fluctuation in the heating of the substrate S can be reduced. In the heating step, the temperature of the first heating plate 83 and the second heating plate 84 may be changed.

In addition, in the heating step, at least one of the metal components contained in the coating films F is heated to its melting point or higher, so as to dissolve at least a portion of the coating film F. For example, in the case where the coating film F is used for a CZTS solar cell, among the components that constitute the coating film F, S and Se are heated to their melting points or higher, so as to liquefy these substances and aggregate the coating film F.

Further, in the heating step, sulfurization or selenization reaction of the Sn atom contained in the coating film F is conducted. For promoting the reaction, the control part CONT supplies a reaction promoter gas such as a sulfur-containing gas (e.g., hydrogen sulfide gas) to the baking room 80a. By sulfurization or selenization of the Sn atom contained in the coating film F, the photoelectric conversion efficiency of the coating film F can be improved.

In the heating step, the control part CONT supplies a gas to the baking room 80a by the gas supply part 87 (the bottom portion supply part 87a, the step portion supply part 87b, the ceiling supply part 87c and the step portion supply part 87d), and suctions the baking room 80a by the discharge part 88 (bottom portion discharge part 88a and the ceiling discharge part 88b). By this operation, not only the atmosphere and pressure inside the baking room 80a are adjusted, but also a stream is formed from the second accommodation part 82 to the first accommodation part 81. By the stream, the solvent component evaporated from the coating films F and the bubbles are swept away, and suctioned by the discharge part 88.

Further, depending on the heating state, the control part CONT stops the gas discharging by the discharge part 88, and supplies a gas such as a nitrogen gas from the gas supply part 87 to the baking room 80a, so as to pressurize the baking room 80a (pressurizing step). For example, the control part CONT may depressurize the baking room 80a until the baking room 80a reaches a predetermined heating temperature. When the baking room 80a reaches the predetermined heating temperature, the control part CONT may switch to pressurizing the baking room 80a. Furthermore, in the case where the substrate S is heated at a predetermined heating temperature for a predetermined time, the control part CONT may maintain the pressurized state while the substrate is being heated. By such operation, the substrate S is heated in a state where the ambient pressure of the coating film F is controlled. As a result, for example, the sulfurization or selenization reaction of the Sn atom can be actively conducted.

In the heating step, transfer of heat from the first heating plate 83 to the bottom portion 81a of the first accommodation part 81 is suppressed by the first heat insulation part 89. Further, transfer of heat from the second heating plate 84 to the ceiling portion 82a of the second accommodation part 82 is suppressed by the second heat insulation part 90. By virtue of such a configuration, the temperature of the chamber apparatus 80 can be prevented from rising too much. While conducting the heating step, the control part CONT allows a cooling medium to flow from the supply part 97a of the cooling medium flow part 97 to the discharge part 97b, so as to cool the first accommodation part 81. Further, the control part CONT allows a cooling medium to flow from the supply part 98a of the cooling medium flow part 98 to the discharge part 98b, so as to cool the second accommodation part 82. By virtue of such a configuration, the temperature of the chamber apparatus 80 can be prevented from rising too much.

Figure 21:
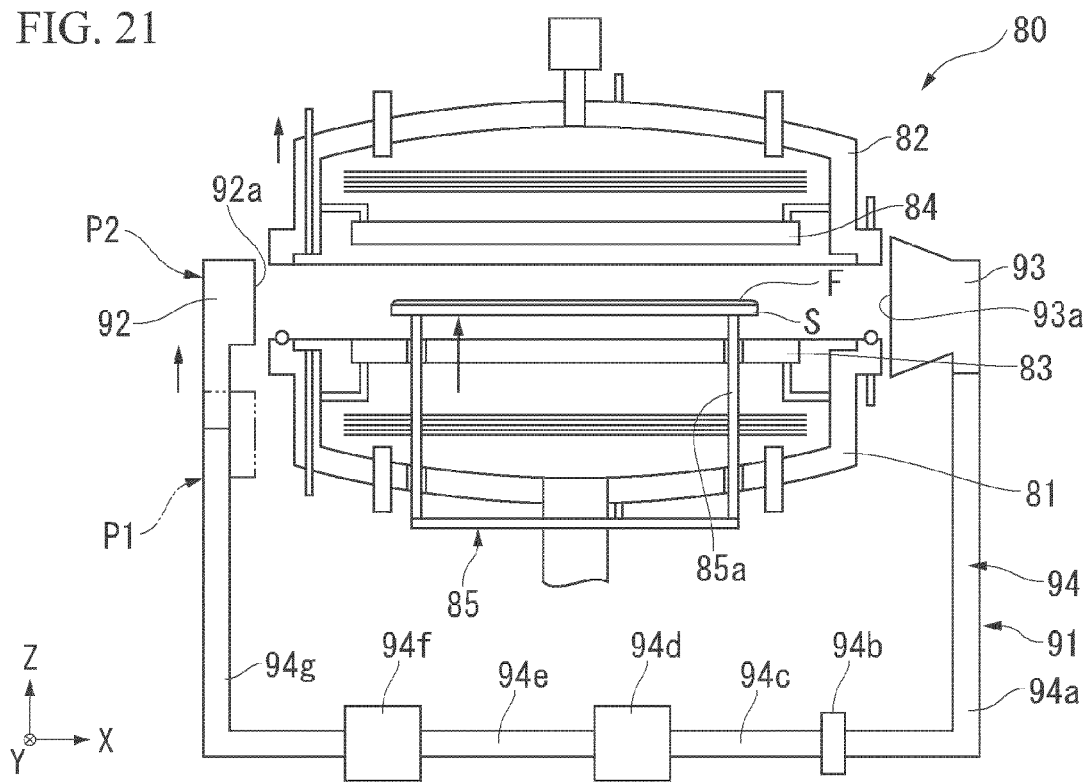
FIG. 21 A diagram showing a step in a baking treatment performed by a coating apparatus according to the present embodiment.

After the completion of the heating step, the coating film F is cooled to a temperature at which the coating film F is solidified (cooling step). In the cooling step, as shown in FIG. 21, the control part CONT firstly moves the second accommodation part 82 in the +Z direction so as to open the chamber apparatus 80, and moves the gas ejection part 92 from the waiting position P1 to the ejection position P2. By such operation, the ejection opening 92a of the gas ejection part 92 is directed to a space between the first accommodation par 81 (first heating plate 83) and the second accommodation part 82 (second heating plate 84).

Figure 22:
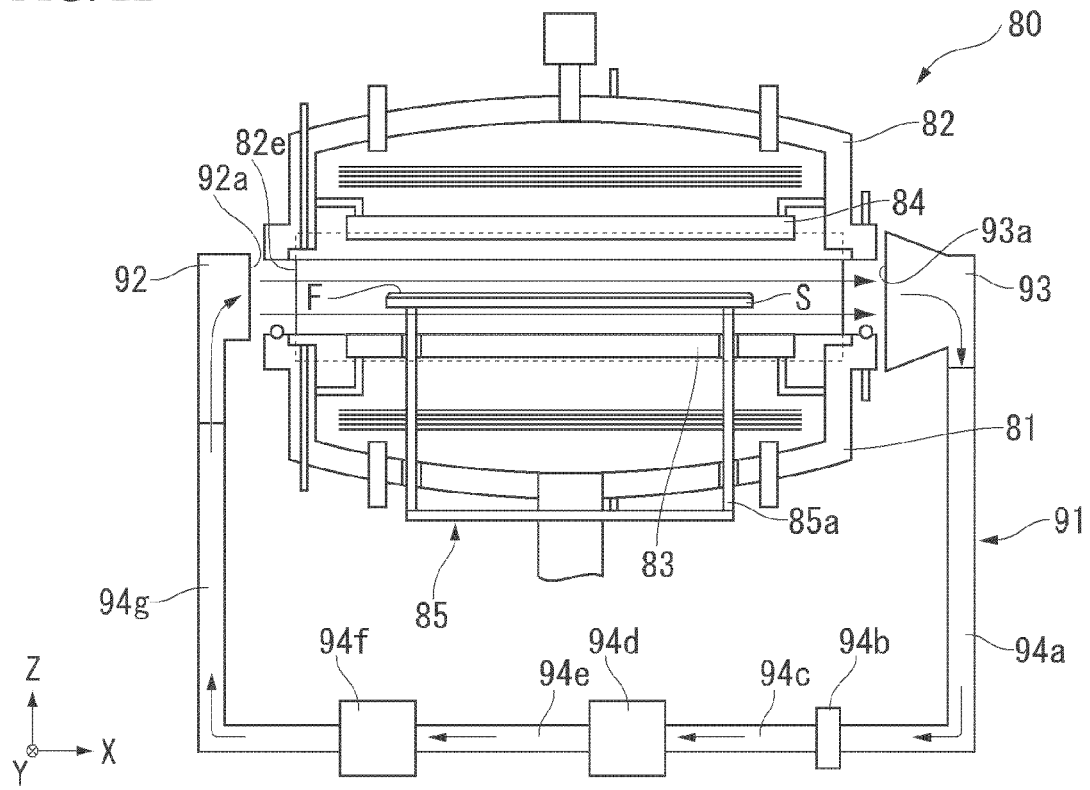
FIG. 22 A diagram showing a step in a baking treatment performed by a coating apparatus according to the present embodiment.

In this state, the control part CONT actuates the blower 94d. By actuating the blower 94d, as shown in FIG. 22, a gas is ejected from the ejection opening 92a of the gas ejection part 92, and the gas is suctioned from the suction opening 93a of the suction part 93. By such operation, the gas ejected from the gas ejection part 92 moves through the space between the first heating plate 83 and the second heating plate 84 in the +X direction, and is suctioned by the suction part 93.

The gas which moves through the space between the first heating plate 83 and the second heating plate 84 in the +X direction absorbs the heat of the first heating plate 83, the second heating plate 84 and the substrate S disposed in the space therebetween, and moves to the suction part 93. As such, the first heating plate 83, the second heating plate 84 and the substrate S (including the coating film F) are cooled by the movement of the gas.

On the other hand, the gas suctioned by the suction part 93 is cooled by the radiator 94b of the circulation part 94, foreign matters are removed therefrom by the filter 94f to be cleaned, and the gas is supplied to the gas ejection part 92. As such, a clean gas with a high heat absorbing efficiency is ejected from the gas ejection part 92. Therefore, by providing the circulation part 94, the cooling efficiency of the first heating plate 83, the second heating plate 84 and the substrate S can be improved, and the inside of the chamber apparatus 80 can be maintained in a clean state.

The gas ejected from the gas ejection part 92 contains not only the components which move toward the suction part 93 in the +X direction, but also the components which move through the space between the first heating plate 83 and the second heating plate 84 in the Y direction and discharged to the outside of the chamber apparatus 80. When the gas is discharged to the outside of the chamber apparatus 80 in such a manner, the conditions of the chamber CB2 may be changed.

As a countermeasure, in the state where the chamber apparatus 80 is opened, the control part CONT moves the gas flow regulating plates 82e provided on the −Y side face and the +Y side face of the second accommodation part 82 in the −Z direction, so as to cover the −Y side face and the +Y side face of the chamber apparatus 80. In the case where the ejection and suction of the gas is performed in such a state, it becomes possible to prevent the gas ejected from the gas ejection part 92 from leaking from the +Y side or −Y side of the chamber apparatus 80. Therefore, the gas ejected from the gas ejection part 92 is more reliably suctioned by the suction part 93, and is re-ejected from the gas ejection part 92 in a state where the gas is cleaned and cooled by the circulation part 94. In this manner, the conditions of the second chamber CB2 can be maintained.

In the cooling step, by solidifying the coating film F, the strength of the coating films F can be enhanced. While conducting the cooling step, the control part CONT may allow a cooling medium to flow from the supply part 97a of the cooling medium flow part 97 to the discharge part 97b, so as to cool the first accommodation part 81. Further, the control part CONT may allow a cooling medium to flow from the supply part 98a of the cooling medium flow part 98 to the discharge part 98b, so as to cool the second accommodation part 82. In this manner, the conditions of the chamber apparatus 80 can be more efficiently controlled.

Figure 23:
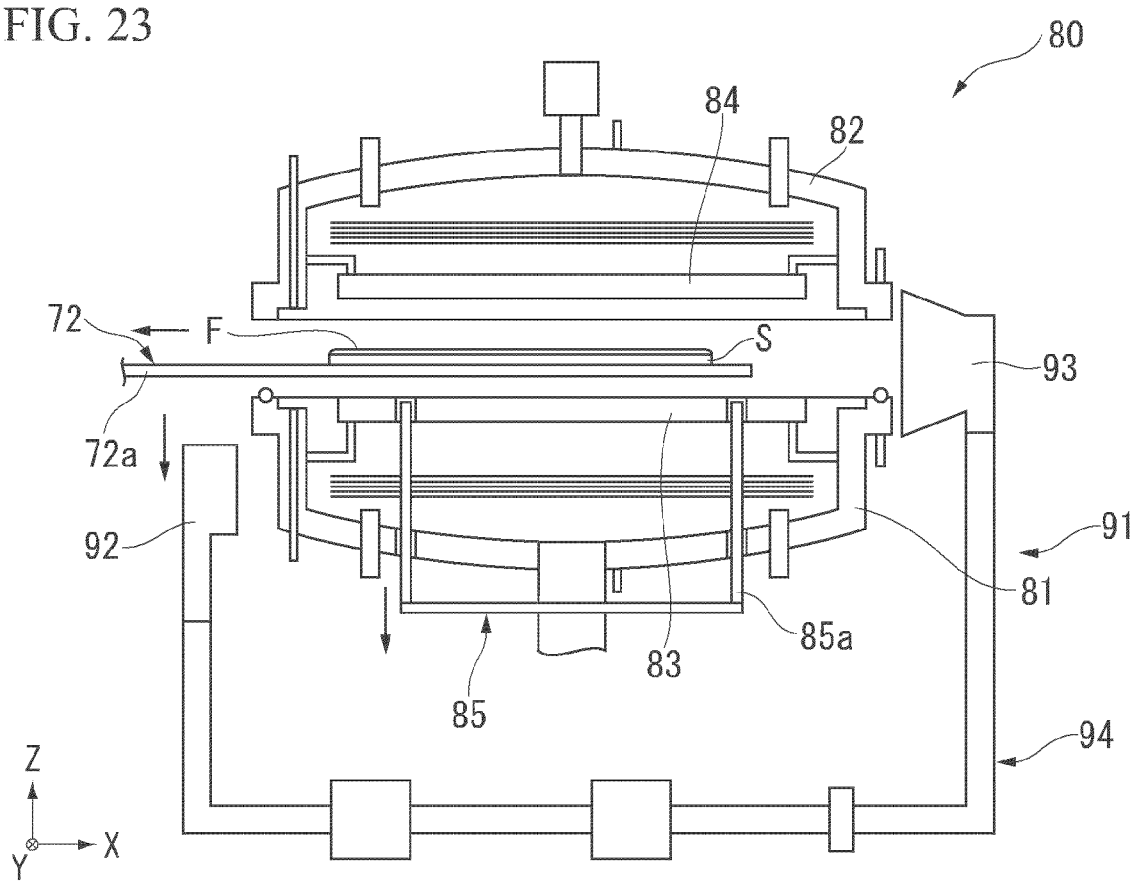
FIG. 23 A diagram showing a step in a baking treatment performed by a coating apparatus according to the present embodiment.

After the cooling step, as shown in FIG. 23, the control part CONT holds the substrate S with the substrate supporting part 72a of the transport arm 72 and unloads the substrate S from the chamber apparatus 80. Then, the control part CONT transports the substrate S in the −X direction. Specifically, the substrate S is unloaded from the baking part BK via the heating part 70, the arm part 71 and the substrate guide stage 66, and is returned to the substrate loading/unloading part LU via the coating part CT. After the substrate S has been returned to the substrate loading/unloading part LU, the control part CONT opens the lid portion 14 in a state where the gate valve V1 is closed. Thereafter, an operator collects the substrate S in the chamber 10, and accommodates a new substrate S in the accommodation room 10a of the chamber 10.

In the case where, after the substrate S has been returned to the substrate loading/unloading part LU, another coating film is formed to be superimposed on the coating film F formed on the substrate S, the control part CONT transports the substrate S to the coating part CT again, and repeats the coating treatment, the vacuum drying treatment and the baking treatment. In this manner, coating film F is laminated on the substrate S.

Figure 24:
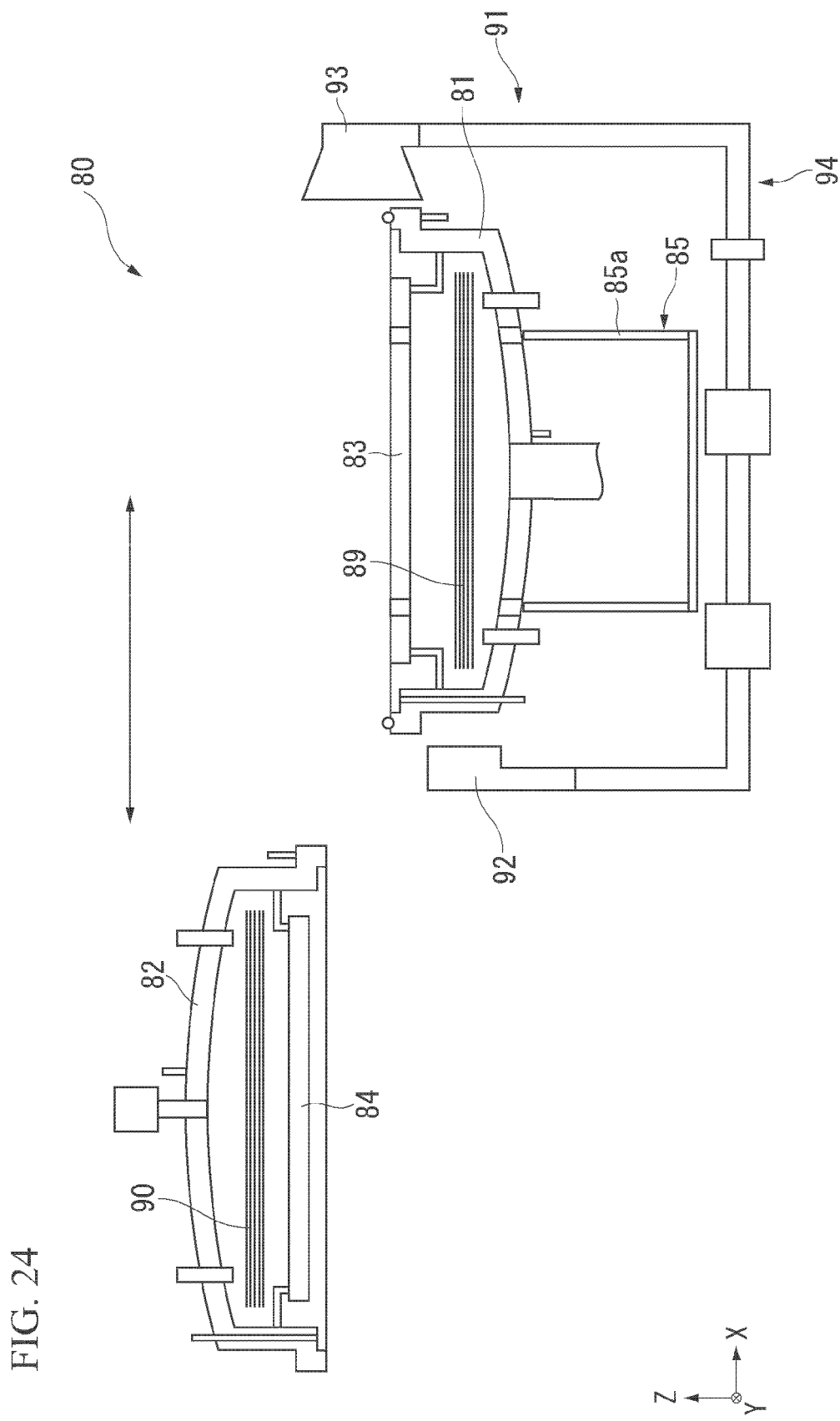
FIG. 24 A diagram showing a state of maintenance of a coating apparatus according to the present embodiment.

Further, in the case where the maintenance of the chamber apparatus 80 is conducted, as shown in FIG. 24, the second accommodation part 82 is slid in the −X direction, so as to displace the first accommodation part 81 with respect to the second accommodation part 82 in the X direction. In such a case, it becomes easier for the worker to access to the components of the first accommodation part 81 and the components of the second accommodation part 82. After the maintenance operation has been completed, the second accommodation part 82 is moved in the +X direction to be returned to the original position, so that the above heating operation can be conducted.

As described above, according to the present embodiment, the substrate S can be heated in a state where the substrate S is sandwiched between the first heating part 83 and the second heating part 84 of the chamber apparatus 80. Further, the baking room 80a of the chamber apparatus 80 can be pressurized or depressurized using the pressure control part including the gas supply part 87 and the discharge part 88. Therefore, the ambient pressure of the coating film F during heating can be controlled to a high pressure or a low pressure, so as to obtain a desired value. As such, a chamber apparatus 80 which exhibits an excellent ability of controlling the ambient conditions of the substrate S can be provided.

The technical scope of the present invention is not limited to the above-described embodiment, but may be appropriately modified into various forms without departing from the spirit of the present invention.

Figure 25:
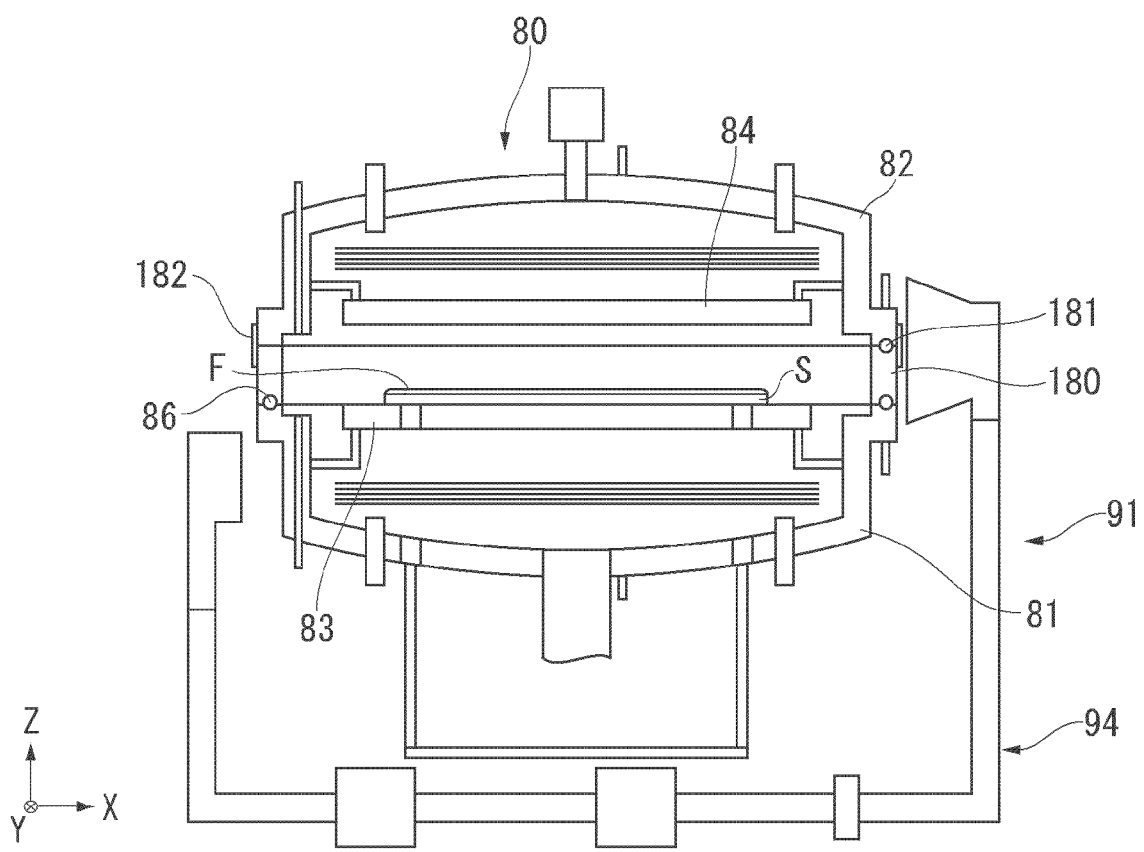
FIG. 25 A diagram showing a configuration of a coating apparatus according to a modified example of the present invention.

For example, as shown in FIG. 25, a configuration may be used in which the heating step is conducted in a state where a spacer member 180 is disposed between the first accommodation part 81 and the second accommodation part 82 of the chamber apparatus 80. In such a configuration, since the volume of the chamber apparatus 80 (volume of the baking room 80a) is increased, the amount of the solvent vaporized which is contained in the coating film F is increased. Further, since the distance between the substrate S (coating film F) and the second heating plate 84 becomes large, the solvent can be more reliably vaporized. As such, the vaporization of the solvent can be promoted.

In the above configuration, the spacer member 180 is formed in a rectangular ring which corresponds to the size of the end portion 81c of the first accommodation part 81 and the end portion 82c of the second accommodation part 82, as viewed in the Z direction. The spacer member 180 has a sealing part 181 formed on one of the bottom faces (the +Z side in FIG. 25). The spacer member 180 is sealed by the sealing part 86 provided on the end portion 81c with respect to the first accommodation part 81, and the sealing part 181 with respect to the second accommodation part 82. As such, even when the spacer member 180 is provided, the airtightness of the chamber apparatus 80 can be maintained. The spacer member 180 is connected to the second accommodation part 82 by the connecting part 182. By connecting the spacer member 180 with the second accommodation part 82, the distance between the substrate loading position (height) in the Z direction and the surface of the first heating plate 83 can be prevented from becoming too large, so that the substrate S can be easily loaded.

As the method of changing the volume of the chamber apparatus 80, apart from the above method in which the spacer member 180 is provided, a configuration may be used in which a portion of the first accommodation part 81 and the second accommodation part 82 can be modified while maintaining the airtightness of the chamber apparatus 80.

Figure 26:
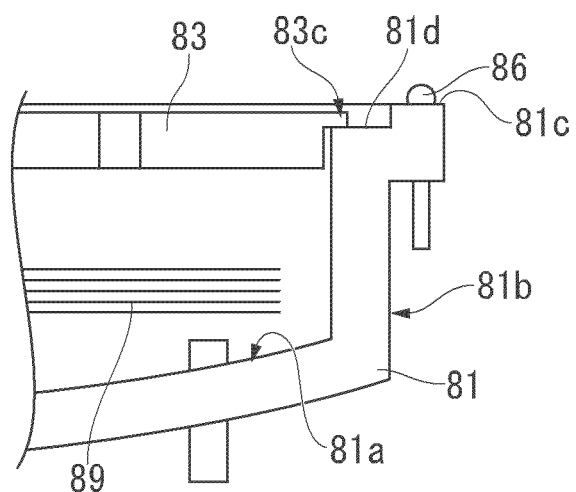
FIG. 26 A diagram showing a configuration of a coating apparatus according to a modified example of the present invention.

Further, in the aforementioned embodiment, explanation was given taking example of a configuration in which the first heating plate 83 is supported on the side wall portion 81b of the first accommodation part 81 by the supporting part 83c. However, the present invention is not limited thereto. For example, as shown in FIG. 26, a configuration may be used in which a flange part 83f is provided on the outer periphery of the first heating plate 83, and the first heating plate 83 is supported by the first accommodation part 81 in a state where the flange part 83f is mounted on the step part 81d of the first accommodation part 81. In such a case, the first heating plate 83 is secured to the first accommodation part 81 by a securing member, so that displacement does not occur.

In this configuration, for example, the flange portion 83f is made of the same material as the main components of the first heating plate 83 (quartz). The flange part 83f is provided over the entire outer periphery of the first heating plate 83. By virtue of such configuration, the gas can be prevented from moving around the outer peripheral side of the first heating plate 83 to the bottom part 81a of the first accommodation part 81. The arrangement of the flange part 83f can be designed, for example, such that the desired temperature distribution of the first heating plate 83 is not affected.

Figure 27:
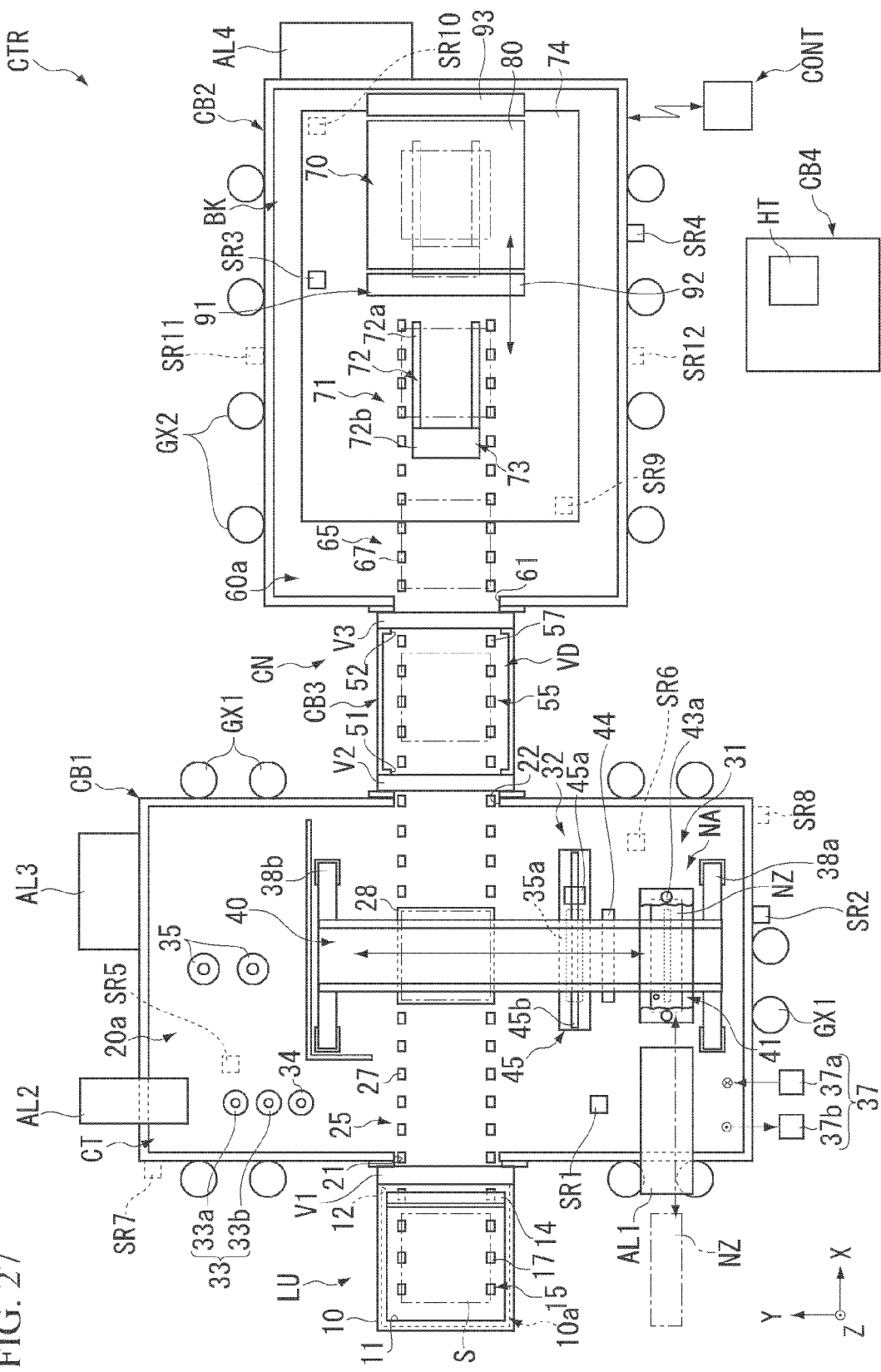
FIG. 27 A diagram showing a configuration of a coating apparatus according to a modified example of the present invention.

In the aforementioned embodiment, explanation was given taking example of a configuration in which the baking operation is conducted by the chamber apparatus 80 in the second chamber CB2. However, the present invention is not limited thereto. For example, as shown in FIG. 27, a configuration may be employed in which a fourth chamber CB4 is provided at a position different from the chamber apparatus 80, and the substrate S is heated by a second chamber apparatus FIT provided on the fourth chamber CB4.

In this case, for example, a coating film F is laminated on the substrate S, and then, a heat treatment (second heating step) can be conducted for baking the laminated coating film F by the second chamber apparatus HT of the fourth chamber CB4. The second chamber apparatus HT may have any configuration as long as it is capable of baking the coating film F. For example, the second chamber apparatus HT may have the same configuration as that of the chamber apparatus 80 described in the aforementioned embodiment. In the second heating step, the heat treatment for heating the coating film F is conducted at a heating temperature higher than that in the heat treatment by the chamber apparatus 80. By this heating treatment, the solid contents (metal components) of the laminated coating film F can be crystallized, thereby further enhancing the film quality of the coating film F.

The heating after laminating the coating film F on the substrate S may be performed by the chamber apparatus 80 of the second chamber CB2. In such a case, in the chamber apparatus 80, the heating temperature for baking the laminated coating film F can be controlled to become higher than the heating temperature for baking each layer of the coating film F.

Figure 28:
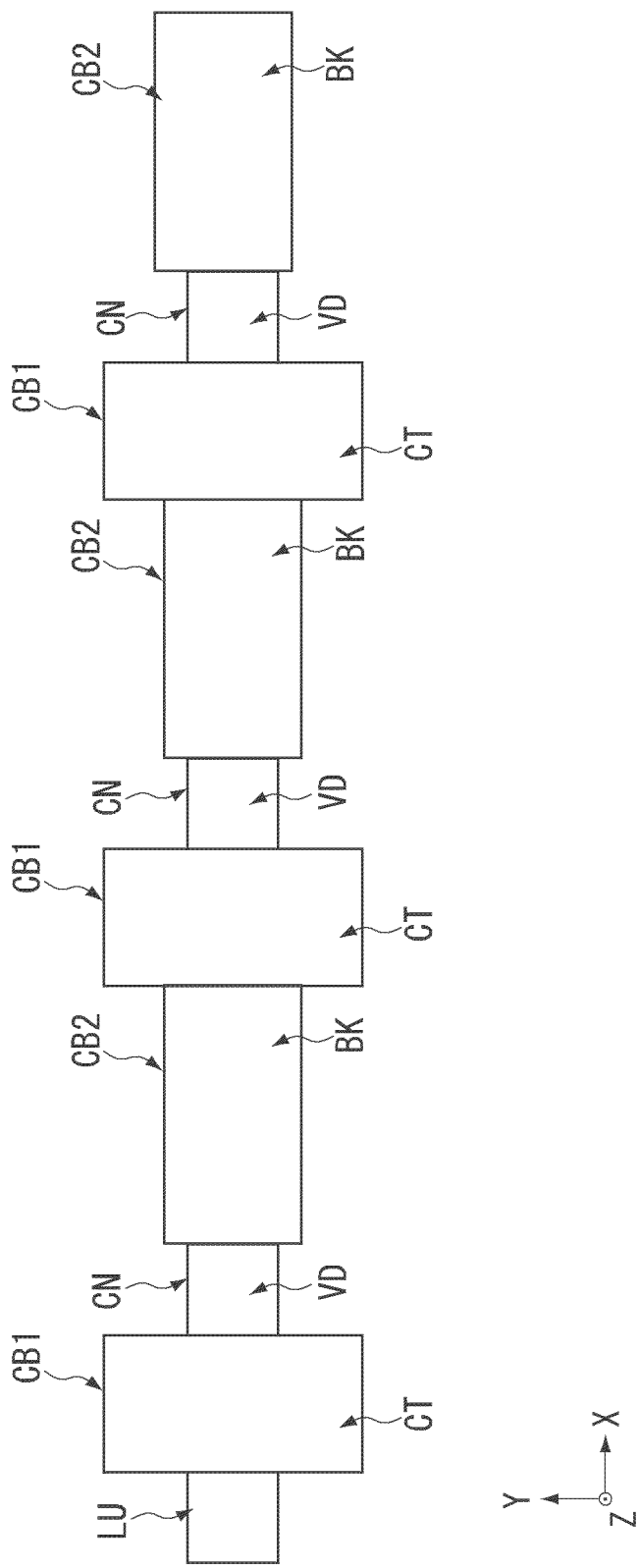
FIG. 28 A diagram showing a configuration of a coating apparatus according to a modified example of the present invention.

Furthermore, with respect to the configuration of the coating apparatus CTR, as shown in FIG. 28 for example, a first chamber CB1 having a coating part CT, a connection part CN having a vacuum drying part VD and a second chamber CB2 having a baking part BK may be repeatedly arranged on the +X-side of the substrate loading/unloading part LU.

In FIG. 28, a configuration in which the first chamber CB1, the connection part CN and the second chamber CB2 are repeatedly arranged three times is shown. However, the present invention is not limited to this configuration, and a configuration in which the first chamber CB1, the connection part CN and the second chamber CB2 are repeatedly arranged twice, or a configuration in which the first chamber CB1, the connection part CN and the second chamber CB2 are repeatedly arranged four times may be employed.

According to this configuration, since the first chamber CB1, the connection part CN and the second chamber CB2 are repeatedly arranged in series in the X-direction, the substrate S can be transported in one direction (+X-direction), and there is no need to transport the substrate S back and forth. Therefore, the step of laminating the coating film on the substrate S can be continuously performed. As a result, coating films can be efficiently formed on the substrate S.

The form and combinations of the components shown in the aforementioned embodiment is only one example, and can be modified depending on the design requirements. For example, in the aforementioned embodiment, the coating part CT has a configuration which uses a slit-type nozzle NZ, but the present invention is not limited thereto. For example, a center-dripping-type coating part or an ink jet coating part may be used. Alternatively, for example, the liquid material disposed on substrates S (a first substrate S1 and a second substrate S2) may be diffused by using a squeezer or the like so as to be coated thereon.

Further, for example, in the case where treatment is conducted using the above coating apparatus CTR, if desired, in at least one of the first chamber CB1, the second chamber CB2, the third chamber CB3 and the chamber apparatus including the chamber apparatus 80, a maintenance treatment or a treatment (e.g., transfer of the structure, cleaning, controlling the atmosphere, controlling the temperature, or the like) for rendering the ambient conditions or internal conditions to a predetermined state (e.g., initial conditions, predetermined atmosphere, predetermined temperature, or the like) can be appropriately conducted at a predetermined timing during operation (e.g., before or after various treatments in each chamber, such as before loading the substrate S to the chamber apparatus, after unloading the substrate S from the chamber apparatus, before ejecting the liquid material Q from the nozzle NZ, after ejecting the liquid material Q, before and after heating by the heating part 53, before and after heating by the first heating plate 83 and the second heating plate 84, and the like) or in a non-operating state.

Further, in the case where the above maintenance treatment or the above treatments for adjusting to a predetermined state are conducted, for example, washing can be conducted with a washing liquid. Further, by using the gas supply part 58, the gas supply part 87 or a corresponding component, at least one or a plurality of gases selected from a nitrogen gas, an oxygen gas, an argon gas, air and water vapor may be appropriately supplied around or inside each chamber apparatus. Further, the transporting system (e.g., rollers, arms, and the like) may be configured to be operable is necessary.

Further, in the aforementioned embodiment, when a configuration in which the coating apparatus CTR is accommodated in one room is employed, a gas supply/exhaust part which adjusts the atmosphere inside the room may be provided. In such a case, hydrazine present in the atmosphere inside the room may be discharged using the gas supply/exhaust part, so that the atmosphere of the entire room can be cleaned, thereby more reliably suppressing change in the coating conditions.

Each of the components described in the above embodiment and the modified examples can be appropriately combined without departing from the scope of the present invention. Further, part of the components among the plurality of components combined may be appropriately not used.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A chamber apparatus comprising:
   a chamber which accommodates a substrate having a coating film formed thereon, the chamber comprising a substrate loading opening where the substrate is loaded;
   a first heating part which is accommodated in the chamber and disposed on a first face side of the substrate;
   a second heating part which is accommodated in the chamber and disposed on a second face side of the substrate opposite to the first face;
   a pressure control part which is capable of pressurizing and depressurizing inside of the chamber in a heated state; and
   gas flow part which allows a temperature control gas to flow between the first heating part and the second heating part,
   the gas flow part comprising:
   a gas ejection opening which is directed from outside of the substrate loading opening to inside of the chamber,
   a suction opening which is provided at a position which sandwiches the first heating part and the second heating part with the gas ejection opening in a flowing direction of the temperature control gas, and
   a circulation path which returns the temperature control gas suctioned from the suction opening to the gas ejection opening.

2. The chamber apparatus according to claim 1, wherein the chamber comprises a gas supply part which supplies a reaction promoter gas to the ambient atmosphere of the coating film.

3. The chamber apparatus according to claim 1, wherein the gas ejection opening is configured to be capable of being lifted up and down.

4. The chamber apparatus according to claim 1, wherein the circulation path comprises a filter which removes foreign matters contained in the temperature control gas.

5. The chamber apparatus according to claim 1, wherein the chamber comprises a first section and a second section which are dividable in one direction.

6. The chamber apparatus according to claim 5, wherein one of the first heating part and the second heating part is provided in the first section, and the other is provided in the second section.

7. The chamber apparatus according to claim 5, wherein the first section and the second section are relatively movable in a direction intersecting with a dividing direction.

8. The chamber apparatus according to claim 7, wherein one of the first section and the second section is configured to be drawable in one direction.

9. The chamber apparatus according to claim 5, wherein the chamber comprises a volume changing part formed in a ring which is inserted between the first section and the second section so as to change the volume of the inside of the chamber.

10. The chamber apparatus according to claim 9, wherein the chamber comprises a connecting part which is provided on one of the first section and the second section and connects the volume changing part.

11. The chamber apparatus according to claim 1, wherein the chamber comprises an inner wall face which surrounds the substrate, and at least a part of the inner wall face is provided with a curved portion which is curved toward outside of the chamber.

12. The chamber apparatus according to claim 11, wherein a heat insulation part is provided at at least one of a position between the inner wall face and the first heating part and a position between the inner wall face and the second heating part.

13. The chamber apparatus according to claim 1, wherein the first heating part and the second heating part each independently comprises an outer periphery heating part which heats a ring-shaped outer peripheral region along an outer periphery of the substrate, and an inner periphery heating part which heats a ring-shaped inner peripheral region provided within the ring-shaped outer peripheral region.

14. A method of heating, comprising:
accommodating a substrate having a coating film formed thereon in a chamber by loading the substrate from a substrate loading opening;
heating the substrate accommodated in the chamber using a first heating part disposed on a first face side of the substrate and a second heating part disposed on a second face side of the substrate opposite to the first face;
switching pressurizing and depressurizing inside of the chamber depending on a heating state of the substrate;
allowing a temperature control gas to flow between the first heating part and the second heating part, the temperature control gas being introduced from a gas ejection opening which is directed from outside of the substrate loading opening to inside of the chamber;
suctioning the temperature control gas from a suction opening which is provided at a position which sandwiches the first heating part and the second heating part with the gas ejection opening in a flowing direction of the temperature control gas; and
returning the temperature control gas suctioned from the suction opening to the gas ejection opening.

* * * * *